(12) United States Patent
Ching et al.

(10) Patent No.: US 10,672,892 B2
(45) Date of Patent: Jun. 2, 2020

(54) SELF-ALIGNED EPITAXY LAYER

(71) Applicant: Taiwan Semiconductor Manufacturing, Co., Ltd., Hsinchu (TW)

(72) Inventors: Kuo-Cheng Ching, Hsinchu County (TW); Chih-Hao Wang, Hsinchu County (TW); Kuan-Lun Cheng, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/504,829

(22) Filed: Jul. 8, 2019

(65) Prior Publication Data

US 2019/0334014 A1    Oct. 31, 2019

Related U.S. Application Data

(62) Division of application No. 15/691,437, filed on Aug. 30, 2017, now Pat. No. 10,347,751.

(51) Int. Cl.

| H01L 29/66 | (2006.01) |
|---|---|
| H01L 27/092 | (2006.01) |
| H01L 29/06 | (2006.01) |
| H01L 29/08 | (2006.01) |
| H01L 21/8238 | (2006.01) |
| H01L 21/02 | (2006.01) |
| H01L 29/165 | (2006.01) |

(Continued)

(52) U.S. Cl.
CPC .... *H01L 29/6681* (2013.01); *H01L 21/02057* (2013.01); *H01L 21/02236* (2013.01); *H01L 21/02532* (2013.01); *H01L 21/823807* (2013.01); *H01L 21/823814* (2013.01); *H01L 21/823821* (2013.01); *H01L 21/823828* (2013.01); *H01L 21/823878* (2013.01); *H01L 27/0924* (2013.01); *H01L 29/0653* (2013.01); *H01L 29/0847* (2013.01); *H01L 29/66545* (2013.01); *H01L 29/161* (2013.01); *H01L 29/165* (2013.01); *H01L 29/41791* (2013.01); *H01L 29/7848* (2013.01)

(58) Field of Classification Search
CPC ............ H01L 29/6681; H01L 29/0653; H01L 29/165
See application file for complete search history.

(56) References Cited

U.S. PATENT DOCUMENTS

| 9,514,995 B1 | 12/2016 | Fogel et al. |
| 9,559,100 B2 | 1/2017 | Chang et al. |

(Continued)

FOREIGN PATENT DOCUMENTS

| TW | 201639161 A | 11/2016 |
| TW | 201709421 A | 3/2017 |

*Primary Examiner* — Amar Movva
(74) *Attorney, Agent, or Firm* — Sterne, Kessler, Goldstein & Fox P.L.L.C.

(57) ABSTRACT

Semiconductor structures including active fin structures, dummy fin structures, epitaxy layers, a Ge containing oxide layer and methods of manufacture thereof are described. By implementing the Ge containing oxide layer on the surface of the epitaxy layers formed on the source/drain regions of some of the FinFET devices, a self-aligned epitaxy process is enabled. By implementing dummy fin structures and a self-aligned etch, both the epitaxy layers and metal gate structures from adjacent FinFET devices are isolated in a self-aligned manner.

20 Claims, 33 Drawing Sheets

(51) Int. Cl.
    *H01L 29/417*     (2006.01)
    *H01L 29/161*     (2006.01)
    *H01L 29/78*     (2006.01)

(56) References Cited

U.S. PATENT DOCUMENTS

| | | |
|---|---|---|
| 2016/0322498 A1 | 11/2016 | Chang et al. |
| 2017/0040324 A1 | 2/2017 | Yang et al. |
| 2017/0213901 A1 | 7/2017 | Ho |

US 10,672,892 B2

SELF-ALIGNED EPITAXY LAYER

This application claims the benefit of U.S. Non-provisional patent application Ser. No. 15/691,437, titled "Self-Aligned Epitaxy Layer," which was filed on Aug. 30, 2017 and is incorporated herein by reference in its entirety.

BACKGROUND

As the size of semiconductor devices continues to shrink, the manufacturing of these devices becomes increasingly difficult. One of the challenges in manufacturing these devices is to accurately pattern the structures from different layers using lithography. For example, spacing between adjacent fin field effect transistor (FinFET) devices are decreasing such that patterning and aligning structures for the adjacent FinFETs become challenging. Exemplary challenges include growing epitaxy layers in the source/drain regions of adjacent FinFETs without merging the epitaxy layers from different fins and patterning gate electrodes of the adjacent FinFETs next to one another.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1A:
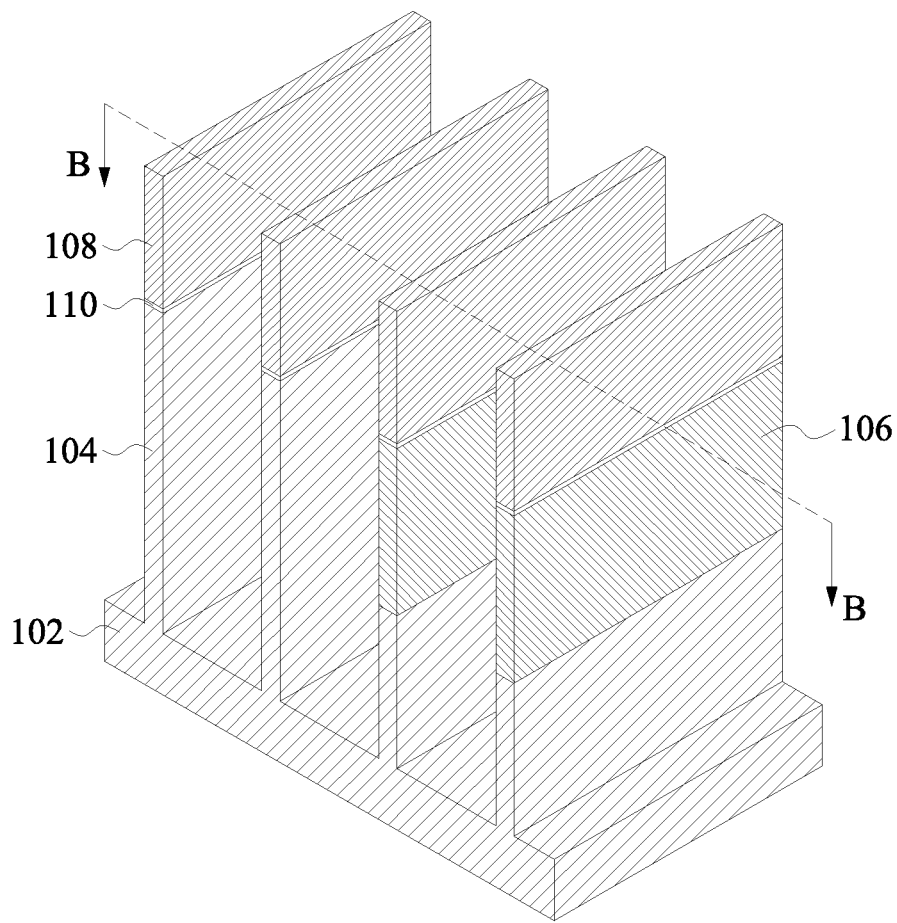
FIGS. 1A-1C are respective isometric, cross-sectional, and top-down views of a partially fabricated fin-based structure after active fin structure formation, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form terminals of a FET.

The term "nominal" as used herein refers to a desired, or target, value of a characteristic or parameter for a component or a process operation. A nominal value for the characteristic or parameter can be set during a design phase of a product or a process and can be a range of values above and/or below the desired value. The range of values can be attributed to, for example, variations in manufacturing processes or tolerances.

The term "vertical," as used herein, means nominally perpendicular to the surface of a substrate.

The expression "epitaxy layer" refers to a layer or structure of single crystal material. Likewise, the expression "epitaxially grown" refers to a layer or structure of single crystal material. Epitaxially-grown material may be doped or undoped.

The performance and scalability of silicon-based transistors are approaching limitations. For example, as device dimensions are scaled down to achieve higher packing density, shrinking silicon-based transistors becomes more challenging. A fin field effect transistor (FinFET) device may be used to address these challenges due to its compact form factor and improved performance such as, for example, drive current enhancement and sub-threshold leakage reduction.

FinFET devices also has its challenges. For example, as the size of a circuit (e.g., a static random access memory (SRAM) circuit) using multiple fins decreases, spacing between adjacent fins also decreases. Two issues can result from the decreased spacing between adjacent fins: 1) a smaller margin for placing contacts to the source/drain regions of adjacent fins; and 2) a smaller margin for patterning the gate structure of adjacent FinFET devices. For the first issue, although an epitaxy layer can be grown on the source/drain regions of the fin to enlarge the landing area for a contact to land, the epitaxy layers from the source/drain regions from adjacent fins increase the risk of electrical shorts by the epitaxy layers touching one another.

For the second issue, patterning the gate electrodes involves isolating the gate electrodes along the fin direction. One way to isolate the adjacent gate electrodes is to etch through the gate electrodes with a dry etch process. As the fin-to-fin spacing between the adjacent fins decreases, the margin for etching the gate electrodes without etching the fins also decreases, making the etching process difficult. In addition, the etching of the gate electrodes can cause damage to the gate electrodes and adversely impact the work function and threshold voltage of the FinFET device. Another way to isolate the adjacent gate electrodes is to form an isolation dielectric before depositing the gate electrodes. This method may eliminate the need of etching the gate electrodes; however, this method has its challenges due to the existence of gate dielectric on the sidewall of the gate isolation which takes up lateral space for the gate electrodes.

The present disclosure describes methods and structures to enable patterning and alignment for device densification and device size shrinkage. In some embodiments, a germanium (Ge) containing oxide is used to enable a self-aligned epitaxy process in the source/drain regions of FinFET devices. The self-aligned epitaxy layer grown on the source/drain regions increases the source/drain landing area for FinFET devices. In some embodiments, a dummy fin structure is used to isolate the self-aligned epitaxy layer from adjacent FinFET devices. In some embodiments, a dummy fin structure is patterned in a self-aligned etch to isolate the gate electrodes from adjacent FinFET devices. Using the self-aligned epitaxy process, the dummy fin structure and the self-aligned etch process, and the self-aligned processes can provide a number of benefits such as, for example, (i) improved process integration; (ii) improved device performance; and (iii) improved margin for device size scaling.

First, the self-aligned epitaxy process with the dummy fin structure removes the need for an additional alignment process and simplifies the process integration. For example, when forming epitaxy layers on the source/drain regions of p-type FinFET devices and n-type FinFET devices, the epitaxy layers are formed in separate steps. Separate lithography steps may be needed to form the epitaxy layers on different FinFET devices. By using a Ge containing oxide, the epitaxy layer formed on the p-type FinFET can be protected during the subsequent growth of the epitaxy layer on the n-type FinFET. The growth of the epitaxy layer on the n-type FinFET can be done in a self-aligned manner. As a result, the lithography and alignment steps to pattern the epitaxy layer formed on the n-type FinFET can be removed and the process integration is simplified.

Second, using a dummy fin with an self-aligned etch process to isolate the gate electrodes eliminates the need to perform an etch process on the gate electrodes. The gate electrodes can be isolated without dry etch damage, thus preventing work function degradation and threshold voltage shift to the FinFET device caused by gate electrode damage.

Third, using a dummy fin can isolate both the gate electrodes and the source/drains in adjacent devices in a self-aligned manner without performing additional lithography steps. For example, the dummy fin can be used to prevent the epitaxy layers formed on adjacent fins from touching one another without performing lithography and alignment steps. Further, the dummy fin with a self-aligned dry etch process can be used to isolate gate electrodes without performing lithography and alignment steps to pattern the gate electrodes.

Figure 16A:
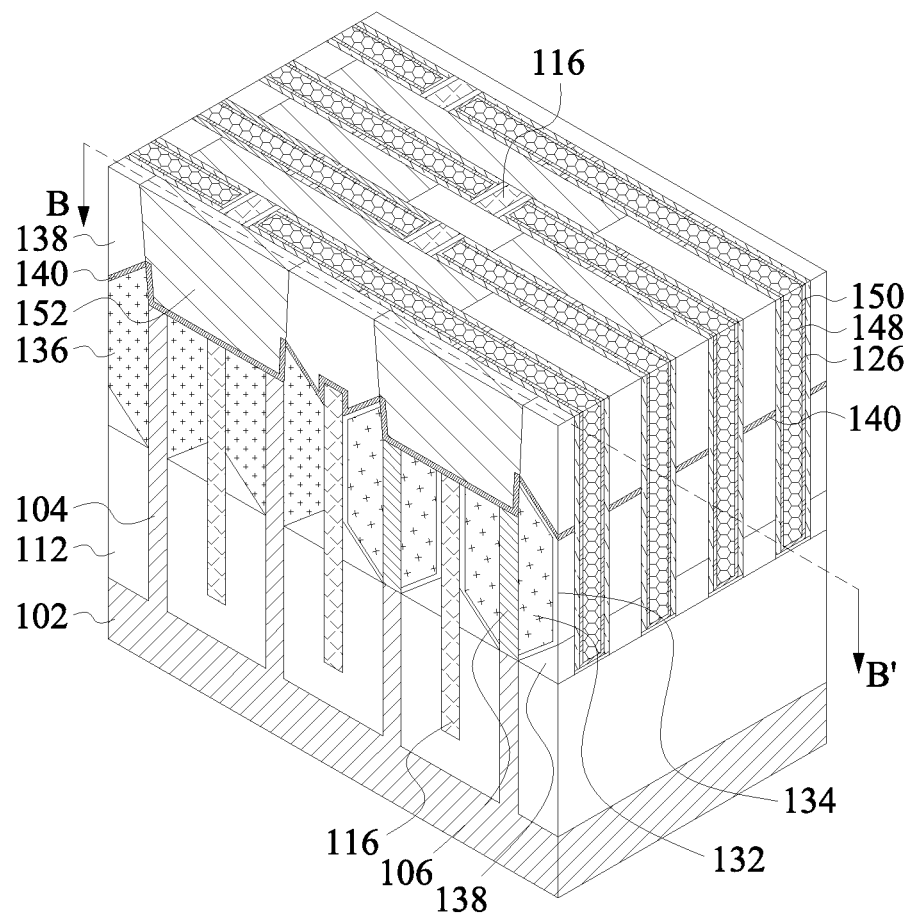
FIGS. 16A-16C are respective isometric, cross-sectional, and top-down views of a partially fabricated fin-based structure after source/drain contact formation, in accordance with some embodiments.
Figure 16B:
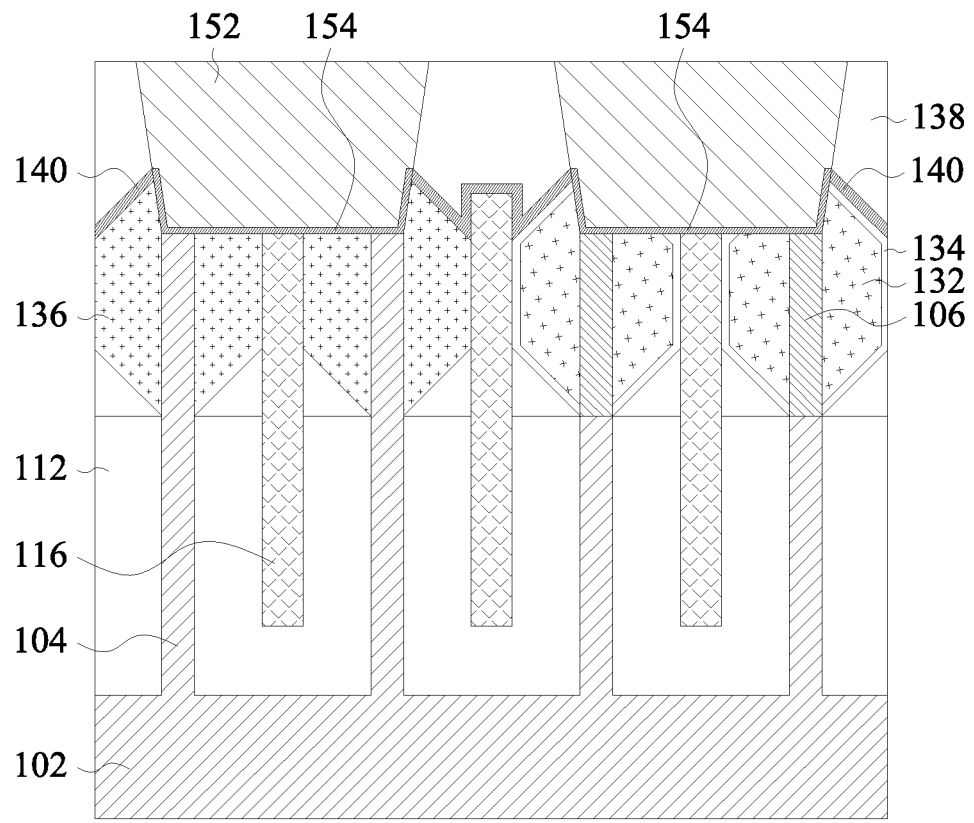
Figure 16C:
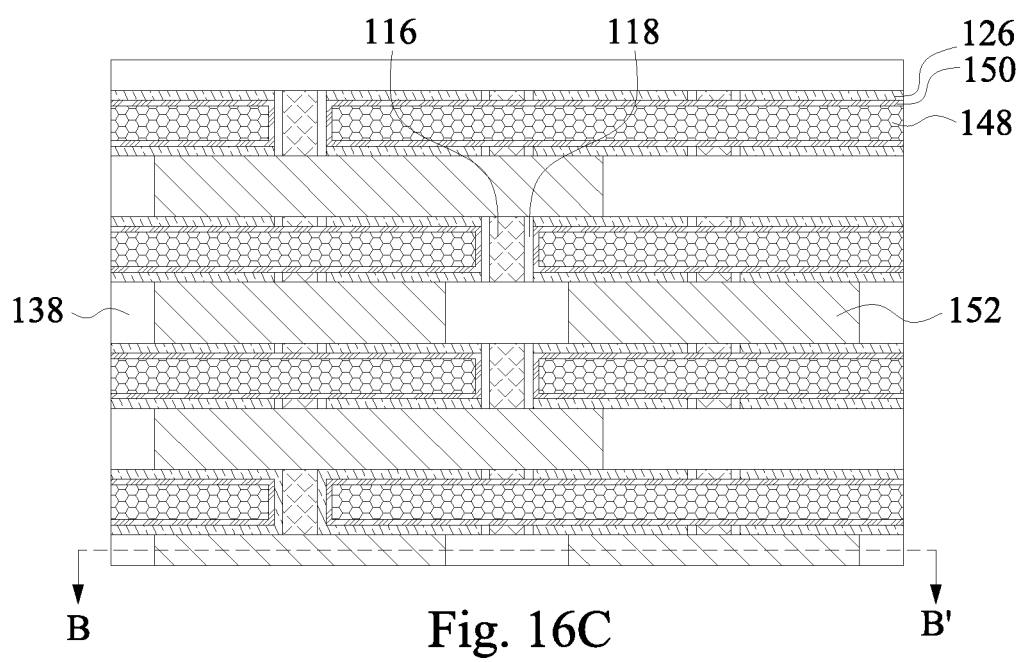
Figure 17:
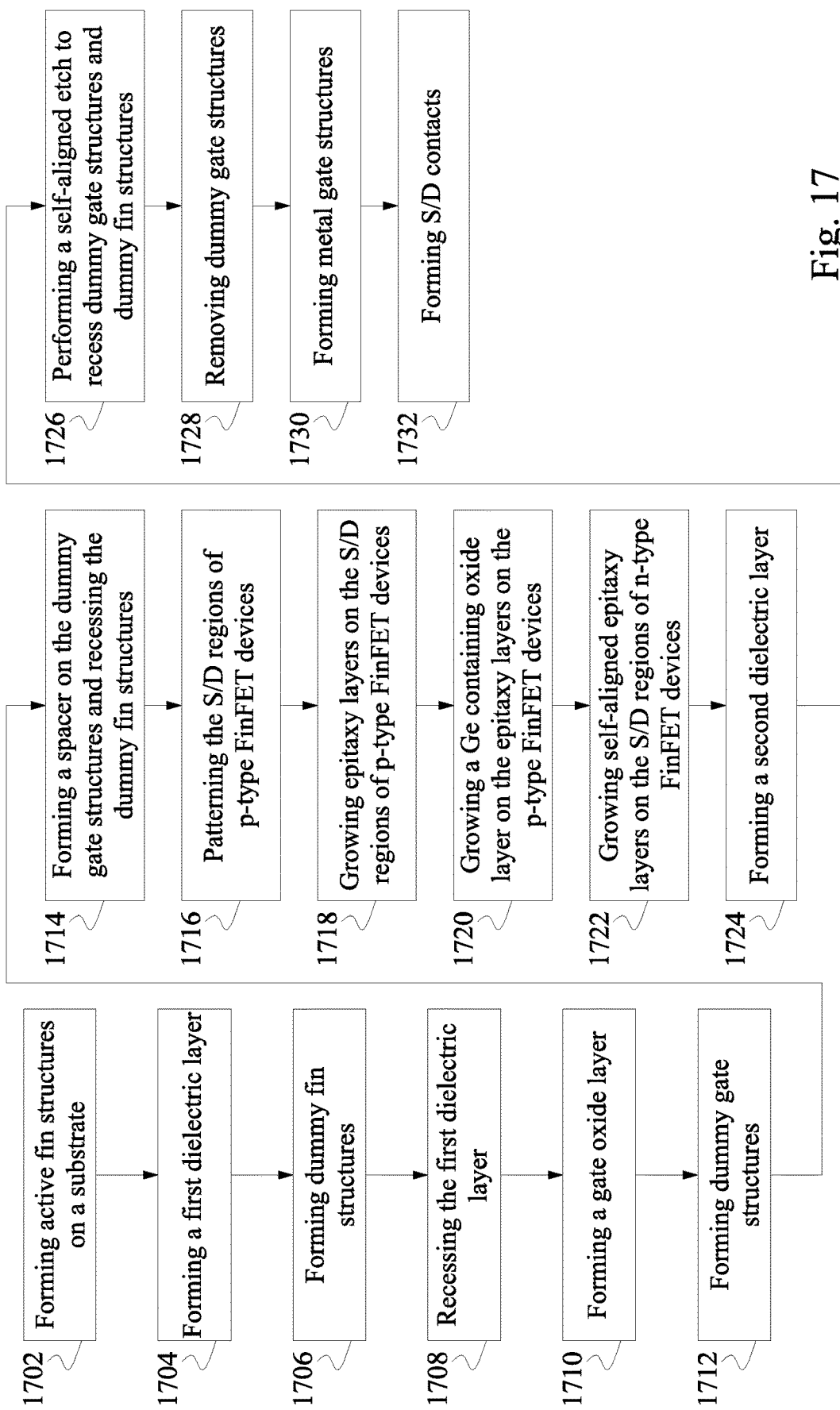
FIG. 17 is a flow diagram illustrating an example method for fabricating a fin-based structure, in accordance with some embodiments.

The present disclosure describes self-aligned epitaxy layers and a dummy fin structure with a self-aligned etch process. FIG. 17 is a flow diagram illustrating an example method 1700 for fabricating a semiconductor structure incorporating the self-aligned epitaxy process, according to some embodiments. FIGS. 1A to 16C are provided as example cross sectional views to facilitate in the explanation of method 1700.

Figure 1B:
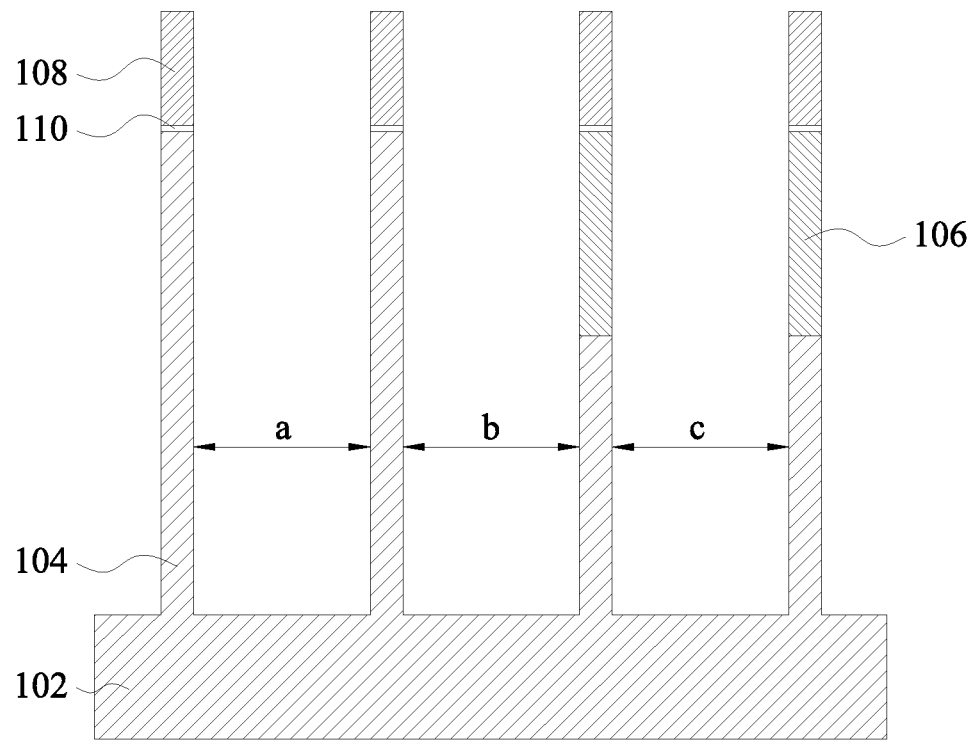
Figure 1C:
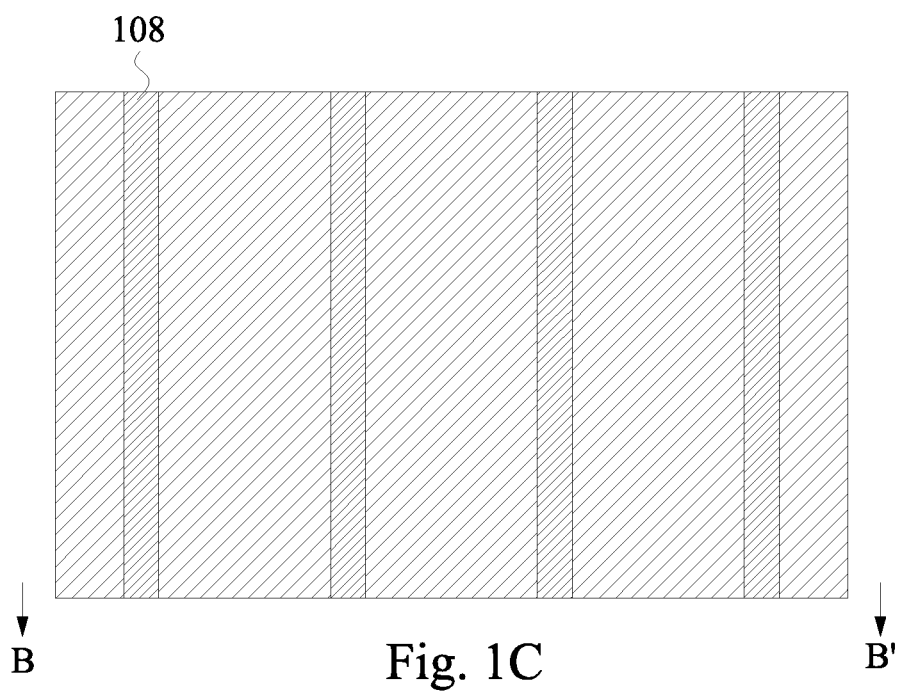

Referring to FIG. 1700, the method 1700 begins at operation 1702 by forming a number of active fin structures on a substrate, according to some embodiments. FIGS. 1A to 1C show a number of active fin structures 104 formed on a substrate 102. FIG. 1A is a 3D view of the exemplary structure. FIG. 1C is a top view of the exemplary structure. FIG. 1B is a cross sectional view of the structure along the B-B' line of the exemplary structure as illustrated by FIGS. 1A and 1C.

The substrate 102 can be made of silicon or some other suitable elementary semiconductor such as, for example, diamond or germanium (Ge); a suitable compound semiconductor such as, for example, silicon carbide (SiC), indium arsenide (InAs), or indium phosphide (InP); or a suitable alloy semiconductor such as, for example, silicon germanium carbide (SiGeC), gallium arsenic phosphide (GaAsP), or gallium indium phosphide (GaInP).

In some embodiments, the active fin structures 104 protrude from the substrate 102, as illustrated by FIG. 1B. In some embodiments, the active fin structures 104 are mutually parallel and extend in one direction, as illustrated by FIGS. 1A to 1C. In some embodiments, the active fin structures 104 can be doped with n-type dopants such as, for example, phosphorus (P) and arsenic (As), or p-type dopants such as, for example, boron (B) and gallium (Ga). In some embodiments, the active fin structures 104 can be doped with one type of dopants (e.g., n-type dopants) while the upper sections 106 of some of the active fin structures 104 are doped with the other type of dopants (e.g., p-type dopants). In some embodiments, the fin structures 104 doped with n-type dopants are used in n-type FinFETs (e.g., NMOS devices), while the fin structures 104 with upper sections 106 doped with p-type dopants are used in in p-type FinFETs (e.g., PMOS devices). In some embodiments, the active fin structures 104 are made of silicon or other suitable materials. In some embodiments, the upper sections 106 of some of the active fin structures 104 are made of a different material from the material of the active fin structures 104, such as, for example, silicon germanium (SiGe).

In some embodiments, the active fin structures 104 are formed by patterning a hardmask layer 108 and etching into the substrate 102 using an anisotropic etch (e.g., dry etch). In some embodiments, the anisotropic etch uses chlorine and/or fluorine based chemicals. The areas covered by the hardmask layer 108 are blocked by the hardmask layer during the anisotropic etch process, and the areas not covered by the hardmask layer 108 are recessed, resulting in the active fin structures 104. In some embodiments, the hardmask layer 108 is made of nitride. In some embodiments, the hardmask layer is formed by a chemical vapor deposition (CVD) process, an atomic layer deposition (ALD) process, or a physical vapor deposition (PVD) process. In some embodiments, there is an additional pad oxide layer 110 between the hardmask layer 108 and the active fin structures 104. In some embodiments, the pad oxide layer 110 is made of silicon dioxide (SiO2). In some embodiments, the pad oxide layer 110 acts as a cushion to reduce the impact of the stress from the hardmask layer 108 on the active fin structures 104 and the substrate 102.

In some embodiments, the active fin structures 104 have a width along the B-B' direction between about 5 nm and about 20 nm (e.g., 10 nm, or between 5 nm and 20 nm). In some embodiments, the active fin structures 104 have a height between about 100 nm and about 140 nm (e.g., between 100 nm and 140 nm) measured from the upper surface of the substrate 102. In some embodiments, the height of the upper sections 106 of the active fin structures 104 is between about 50 nm and about 60 nm (e.g., between 50 nm and 60 nm). In some embodiments, the distance between adjacent fin structures 104 without upper sections 106 (e.g., distance as illustrated in FIGS. 1B and 1C) is between about 25 nm and about 55 nm (e.g., between 25 nm and 55 nm). In some embodiments, the distance between adjacent fin structures 104 with upper sections 106 (e.g., distance c illustrated in FIG. 1B and 1C) is between about 25 nm and about 55 nm (e.g., between 25 nm and 55 nm). In some embodiments, the distance between a fin structure 104 without upper section 106 and an adjacent fin structure 104 with an upper section 106 (e.g., distance b illustrated in FIG. 1B and 1C) is between about 25 nm and about 55 nm (e.g., between 25 nm and 55 nm). In some embodiments, the widths of the active fin structures 104 and the upper sections 106 of some of the active fin structures 104 are the same. In some embodiments, the hardmask layer 108 has a height between about 20 nm and about 40 nm (e.g., between 20 nm and 40 nm).

Figure 2A:
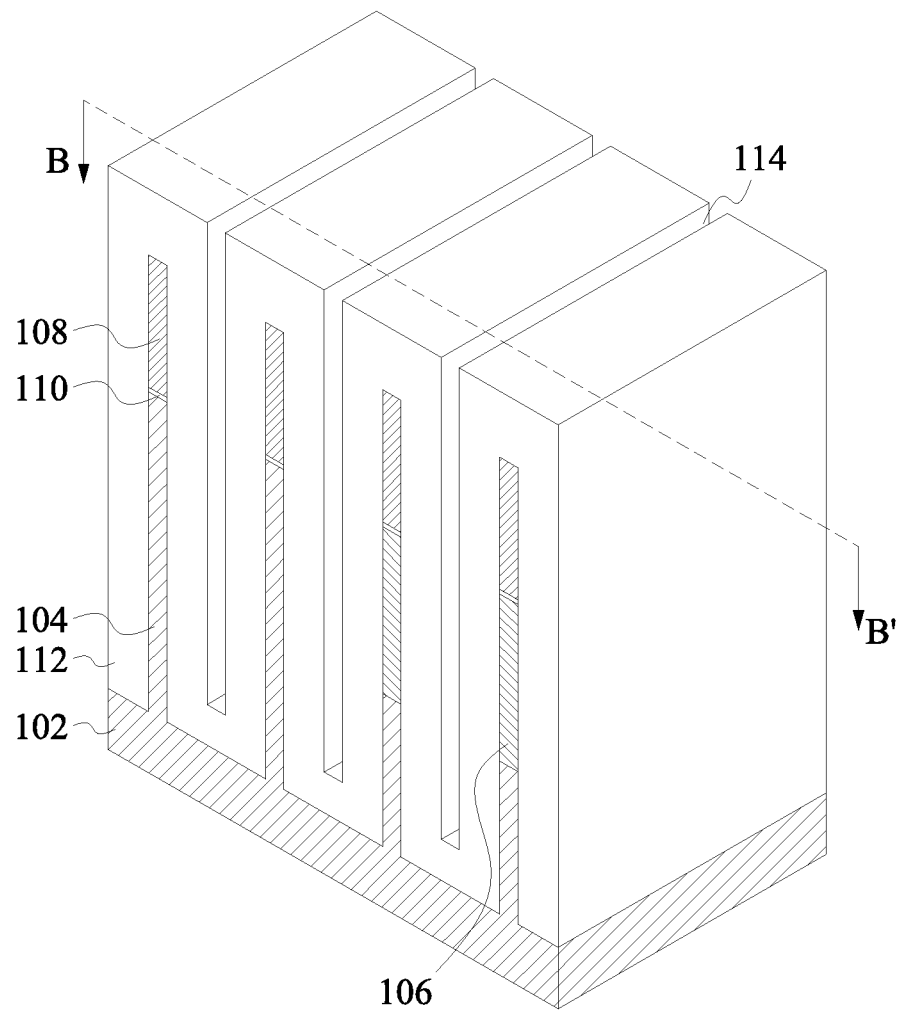
FIGS. 2A-2C are respective isometric, cross-sectional, and top-down views of a partially fabricated fin-based structure after formation of a dielectric layer, in accordance with some embodiments.
Figure 2B:
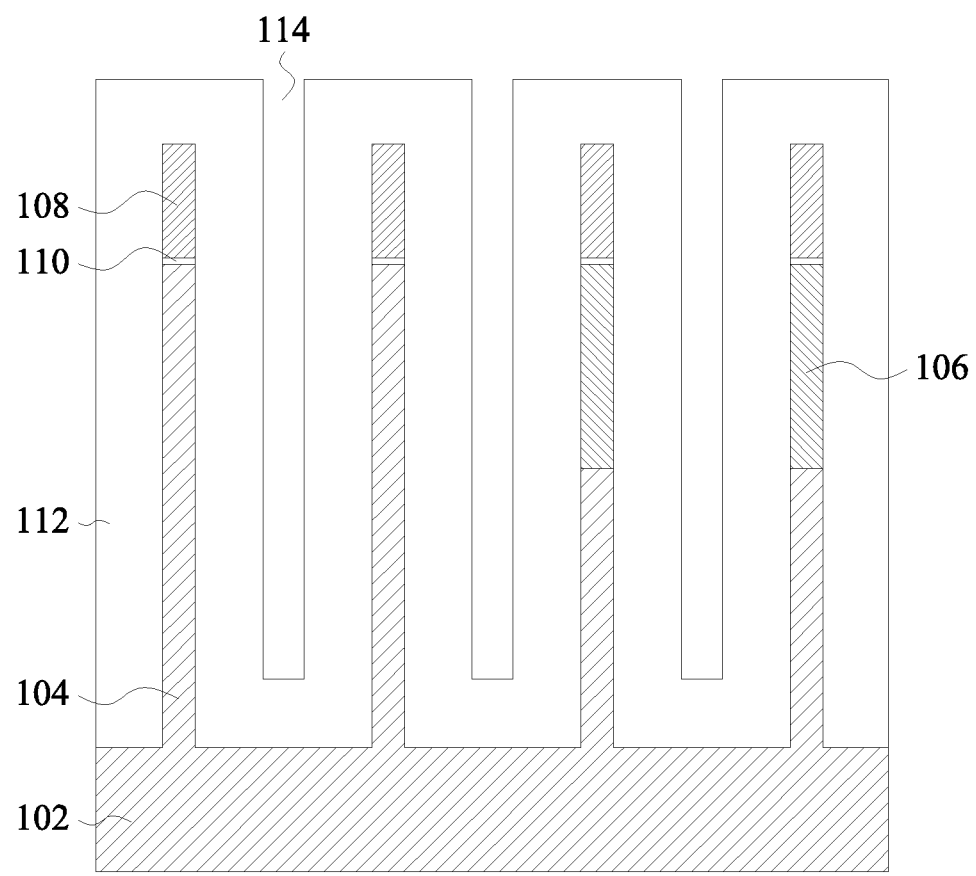
Figure 2C:
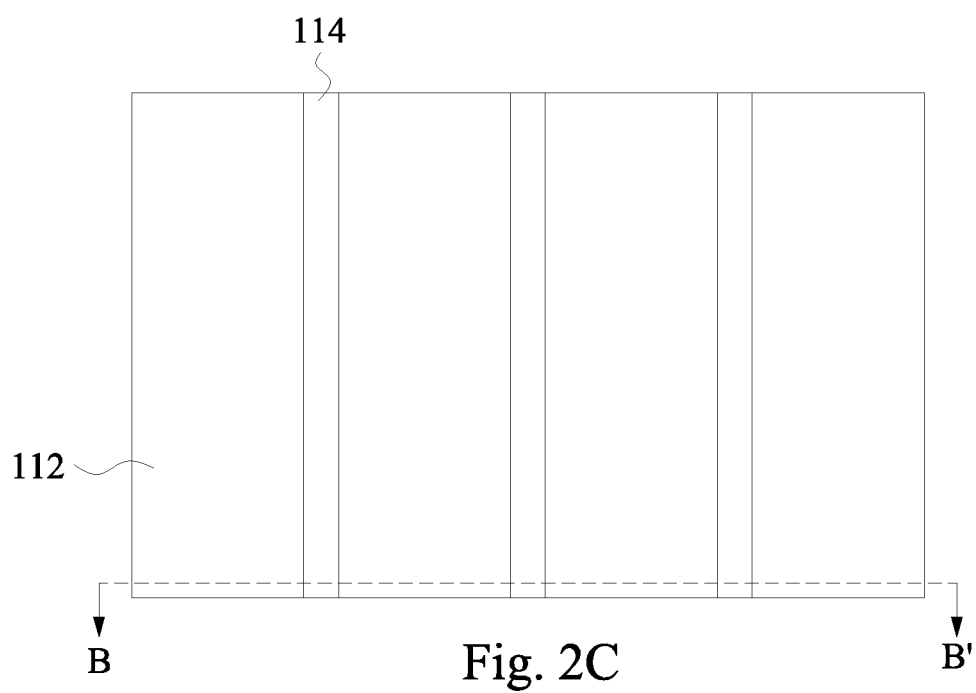

Referring to FIG. 1700, the method 1700 proceeds to operation 1704 by forming a first dielectric layer on the active fin structures 104, according to some embodiments. FIGS. 2A to 2C show a first dielectric layer 112 formed on the fin structures 104. FIG. 2A is a 3D view of the exemplary structure. FIG. 2C is a top view of the exemplary structure. FIG. 2B is a cross sectional view of the structure along the B-B' line of the exemplary structure as illustrated by FIGS. 2A and 2C.

In some embodiments, the first dielectric layer 112 is an oxide layer. In some embodiments, the first dielectric layer 112 is deposited with an ALD process. In some embodiments, the ALD process is performed at a temperature between about 200° C. and about 400° C. (e.g., between 200° C. and 400° C.). In some embodiments, the first dielectric layer 112 is deposited (e.g., uniformly deposited) over the fin structures 104, the upper sections 106, the hardmask layer 108, and the substrate 102. In some embodiments, the thickness of the first dielectric layer 112 is between about 12 nm and about 18 nm (e.g., between 12 nm and 18 nm). In some embodiments, the deposition of the first dielectric layer 112 over the fin active structures 104 forms a number of trenches 114 between adjacent fin structures 104, as illustrated by FIG. 2A to 2C. In some embodiments, the width of the trenches 104 is between about 5 nm and about 20 nm (e.g., 10 nm or between 5 nm and 20 nm). In some embodiments, the width of the trenches 114 is the same as the fin active structures 104 or the upper sections 106 of some of the fin active structures 104.

Figure 3A:
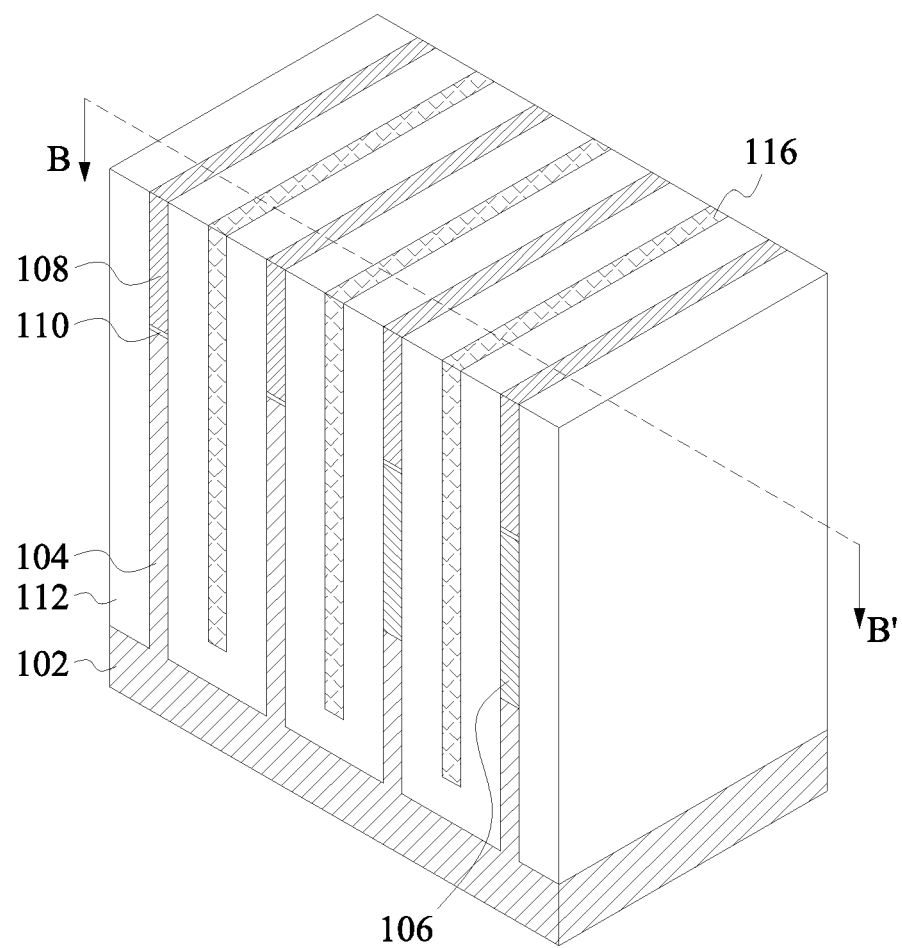
FIGS. 3A-3C are respective isometric, cross-sectional, and top-down views of a partially fabricated fin-based structure after formation of dummy fin structures, in accordance with some embodiments.
Figure 3B:
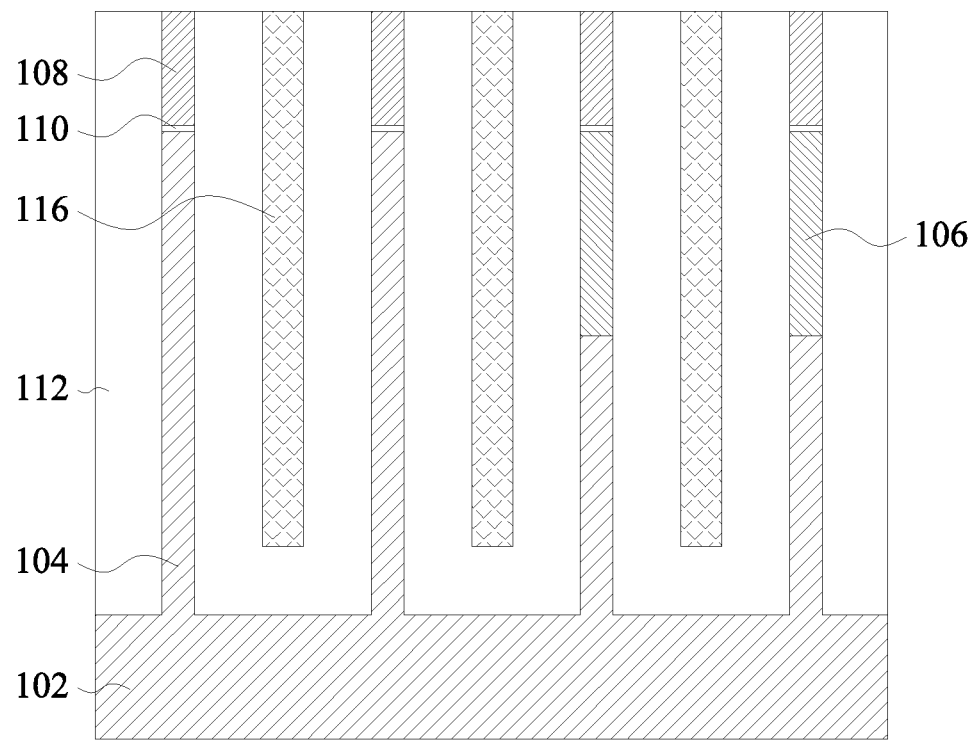
Figure 3C:
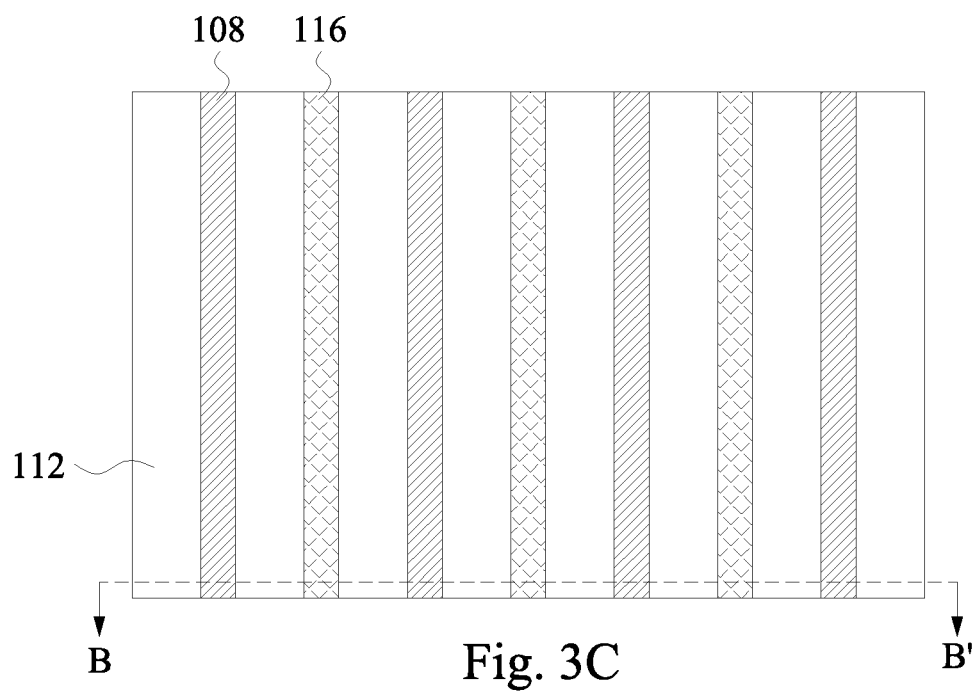

Referring to FIG. 1700, the method 1700 proceeds to operation 1706 by forming dummy fin structures in the trenches 114, according to some embodiments. FIGS. 3A to 3C show a number of dummy fin structures 116 formed in the trenches 114 between the active fin structures 104. FIG. 3A is a 3D view of the exemplary structure. FIG. 3C is a top view of the exemplary structure. FIG. 3B is a cross sectional view of the structure along the B-B' line of the exemplary structure as illustrated by FIGS. 3A and 3C.

In some embodiments, forming the dummy fin structures 116 includes filling the trenches 114 with a dummy fin material. In some embodiments, the filling of the trenches is performed by an ALD process or a CVD process. In some embodiments, the ALD process of filling the trenches 114 with the dummy fin material is performed at a temperature between about 400° C. and about 600° C. (e.g., between 400° C. and 600° C.). In some embodiments, the dummy fin material includes silicon carbon nitride (SiCN), silicon oxygen carbon nitride (SiOCN), or metal oxides such as, for example, hafnium oxide ($HfO_2$), zirconium oxide ($ZrO_2$), and aluminum oxide ($Al_2O_3$). In some embodiments, forming the dummy fin structures 116 further includes performing a planarization step (e.g., a chemical mechanical polish (CMP) step) to remove the excess dummy fin materials on the upper surface of the first dielectric layer 112, so that the upper surface of the first dielectric layer 112, the upper surface of the hardmask layer 108, and the upper surface of the dummy fin structures 116 are coplanar. In some embodiments, the width of the dummy fin structures 116 is the same as the width of the trenches 114 when the dummy fin structures 116 fill the trenches 114. In some embodiments, the width of the dummy fin structures 116 is between about 5 nm and about 20 nm (e.g., 10 nm or between 5 nm and 20 nm). In some embodiments, the width of the dummy fin structures 116 is the same as the fin active structures 104 or the upper sections 106 of some of the fin active structures 104.

Figure 4A:
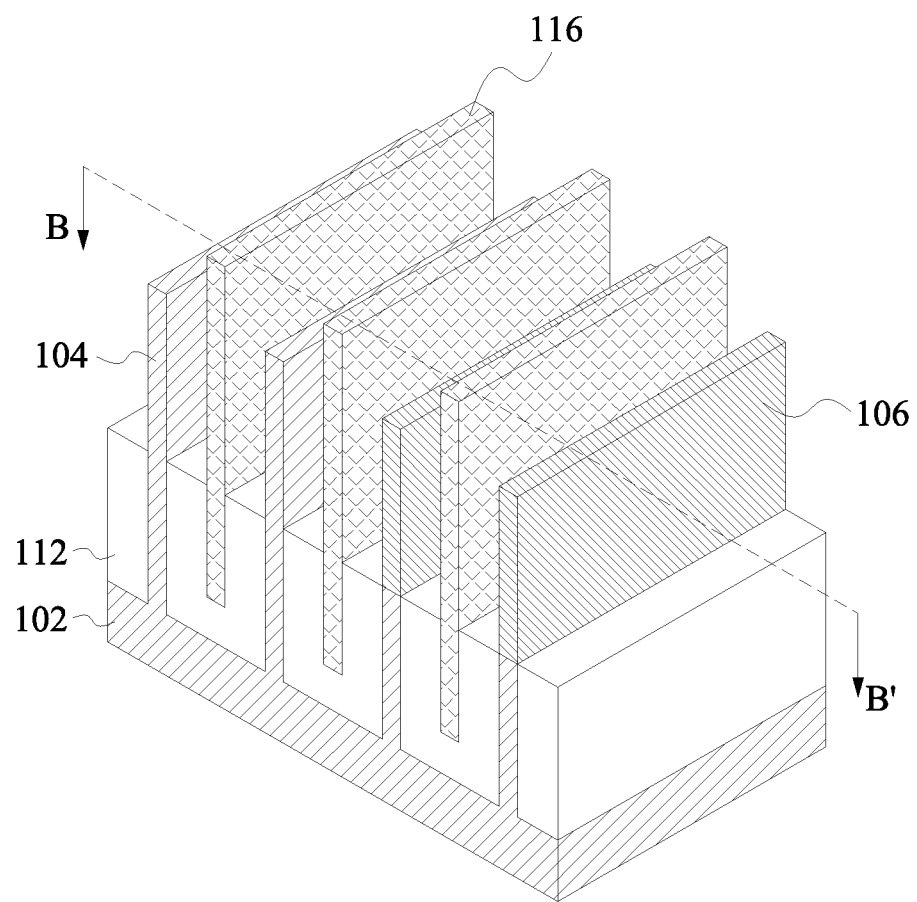
FIGS. 4A-4C are respective isometric, cross-sectional, and top-down views of a partially fabricated fin-based structure after recessing a dielectric layer, in accordance with some embodiments.
Figure 4B:
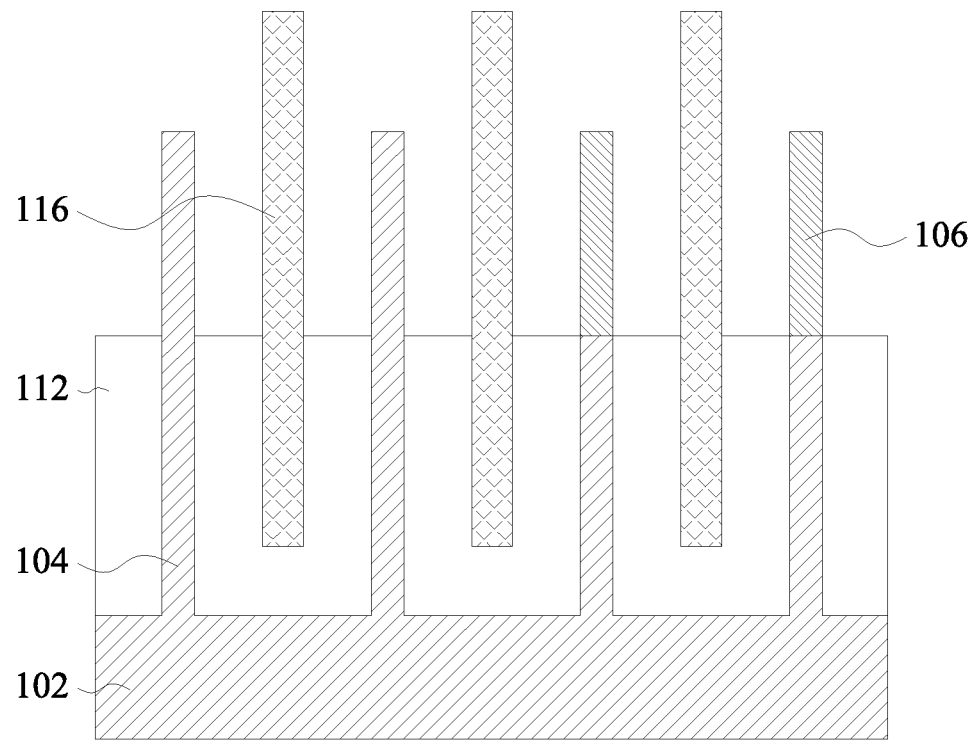
Figure 4C:
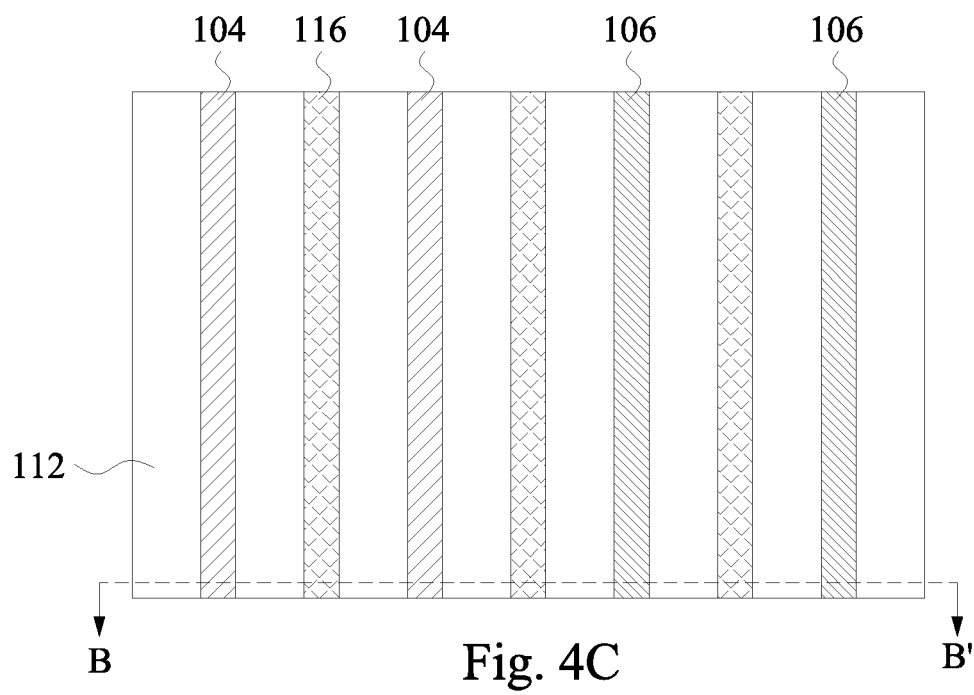

Referring to FIG. 1700, the method 1700 proceeds to operation 1708 by recessing the first dielectric layer 112, according to some embodiments. FIGS. 4A to 4C show that the first dielectric layer 112 is recessed below the top surfaces of the active fin structures 104. FIG. 4A is a 3D view of the exemplary structure. FIG. 4C is a top view of the exemplary structure. FIG. 4B is a cross sectional view of the structure along the B-B' line of the exemplary structure as illustrated by FIGS. 4A and 4C.

In some embodiments, the first dielectric layer 112 is recessed using a chemical etching process with gas based chemicals that etches oxides. In some embodiments, the chemical etching process is a timed etch process. In some embodiments, the recessing of the first dielectric layer 112 further includes removing the hardmask layer 108. In some embodiments, removing the hardmask layer 108 includes performing a wet chemical process with phosphoric acid ($H_3PO_4$) that etches nitrides. In some embodiments, the recessing of the first dielectric layer 112 further includes removing the pad oxide layer 110.

In some embodiments, the first dielectric layer 112 is recessed so that the top surface of the first dielectric layer 112 is below the top surface of the active fin structures 104. In some embodiments, the height of the active fin structures 104 measured from the top surface of the first dielectric layer 112 to the top surface of the active fin structures is between about 50 nm and about 60 nm (e.g., between 50 nm and 60 nm). In some embodiments, the bottom surface of the dummy fin structures 116 is below the top surface of the first dielectric layer 112, so that the dummy fin structures are stabilized by the first dielectric layer 112 and do not collapse. In some embodiments, the height of the dummy fin structures are taller than the active fin structures 104 due to the removal of the hardmask layer 108 on the active fin structures 104. In some embodiments, the height of the dummy fin structures 104 measured from the top surface of the first dielectric layer 112 to the top surface of the dummy fin structures is between about 70 nm and about 100 nm (e.g., between 70 nm and 100 nm). In some embodiments, the upper sections 106 of some of the active fin structures 104 has a bottom surface coplanar with the upper surface of the first dielectric layer 112, as illustrated by FIG. 4B, so that the upper section 106 is exposed from the first dielectric layer 112.

Figure 5A:
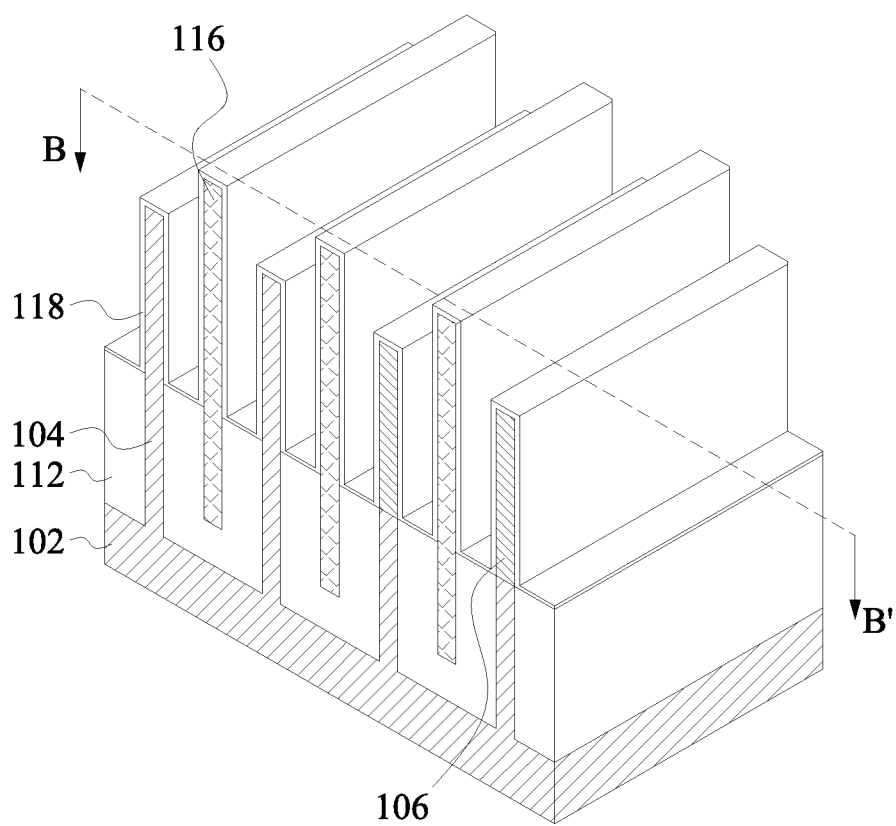
FIGS. 5A-5C are respective isometric, cross-sectional, and top-down views of a partially fabricated fin-based structure after gate oxide formation, in accordance with some embodiments.
Figure 5B:
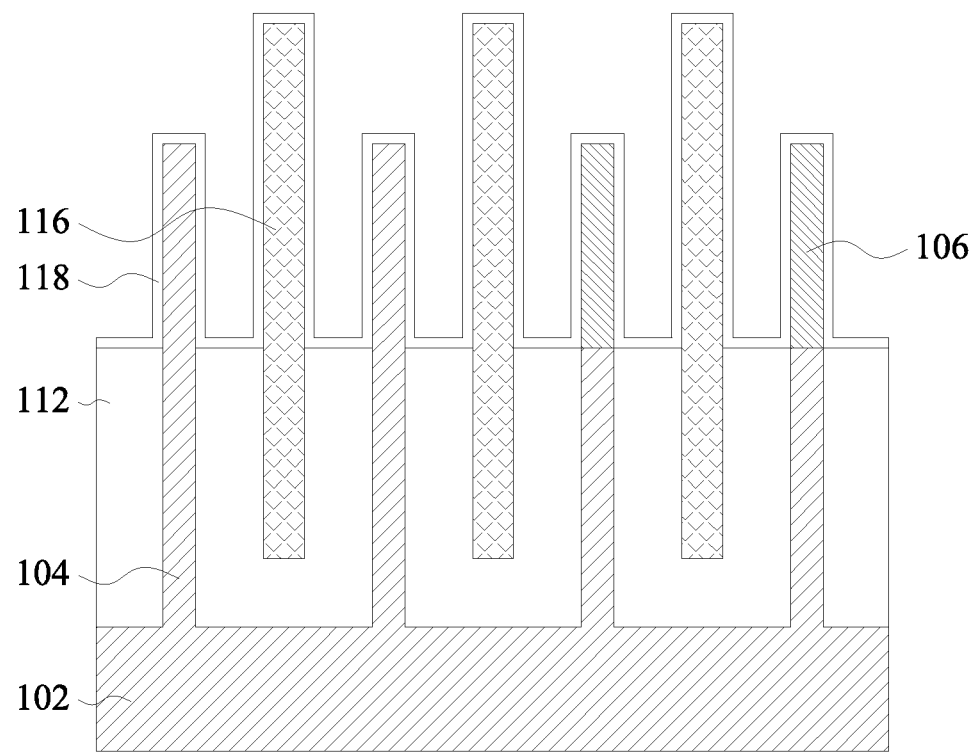
Figure 5C:
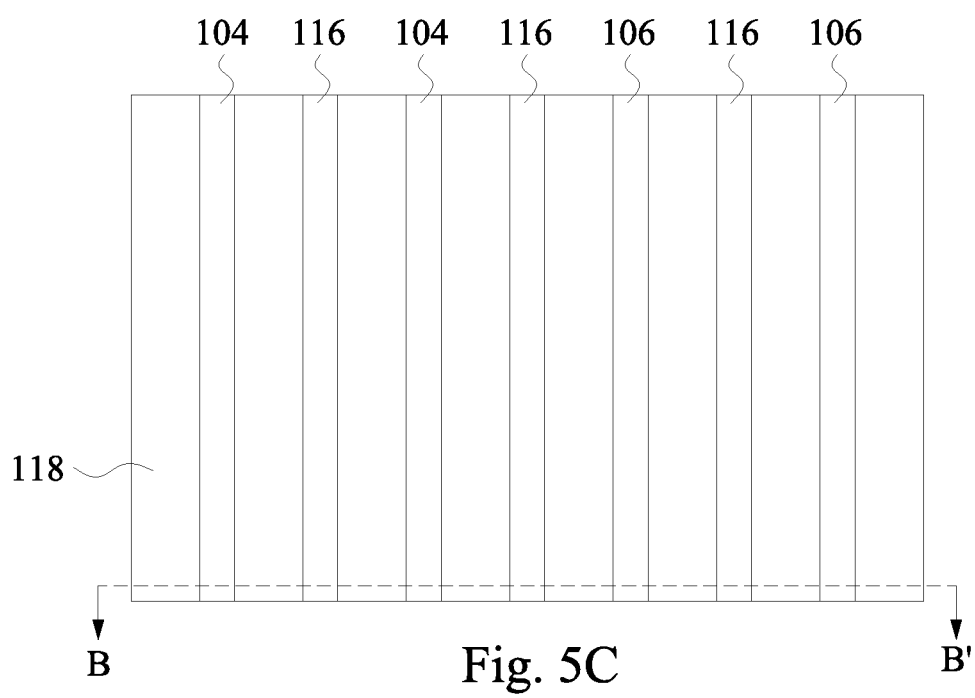

Referring to FIG. 1700, the method 1700 proceeds to operation 1710 by forming a gate oxide layer on the active fin structures, according to some embodiments. FIGS. 5A to 5C show a gate oxide layer 118 is formed on the active fin structures 104, the upper sections 106 of some of the active fin structures 104, the dummy fin structures 116, and the first dielectric layer 112. FIG. 5A is a 3D view of the exemplary structure. FIG. 5C is a top view of the exemplary structure. FIG. 5B is a cross sectional view of the structure along the B-B' line of the exemplary structure as illustrated by FIGS. 5A and 5C.

In some embodiments, forming the gate oxide layer 118 is performed using an ALD process or a CVD process. In some embodiments, the ALD process of forming the gate oxide layer 118 is performed at a temperature between about 200° C. and about 400° C. (e.g., between 200° C. and 400° C.). In some embodiments, the gate oxide layer 118 includes silicon oxide ($SiO_x$) or other suitable materials. In some embodiments, the thickness of the gate oxide layer 118 is between about 2 nm and about 4 nm (e.g., between 2 nm and 4 nm). In some embodiments, the gate oxide layer is used as gate dielectric for high voltage devices.

Figure 6A:
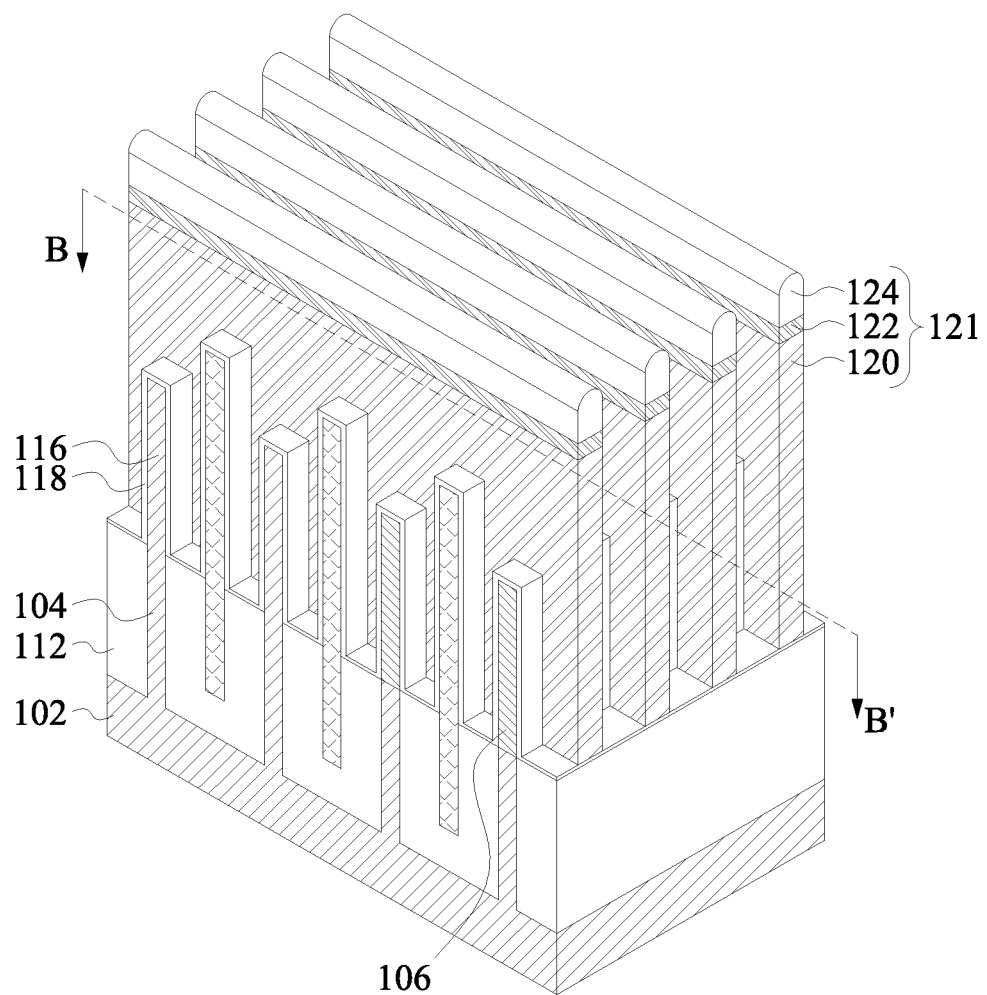
FIGS. 6A-6C are respective isometric, cross-sectional, and top-down views of a partially fabricated fin-based structure after dummy gate structure formation, in accordance with some embodiments.
Figure 6B:
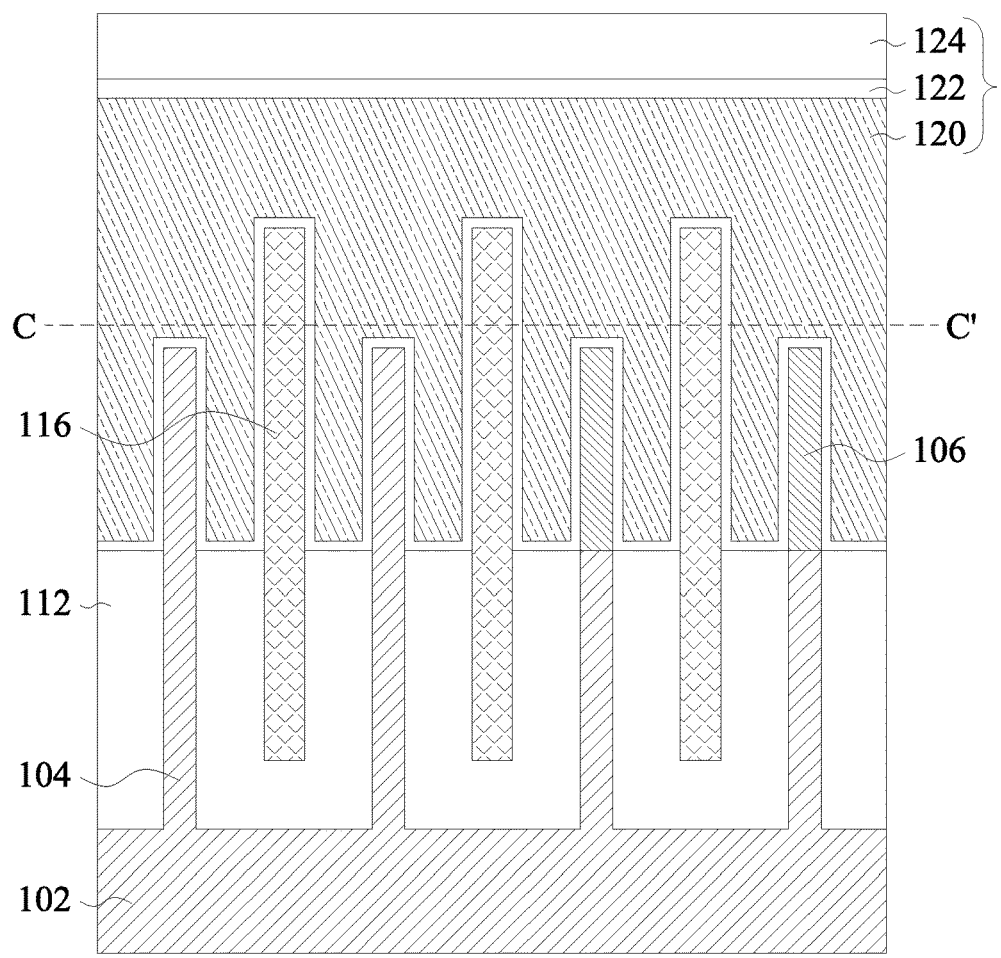
Figure 6C:
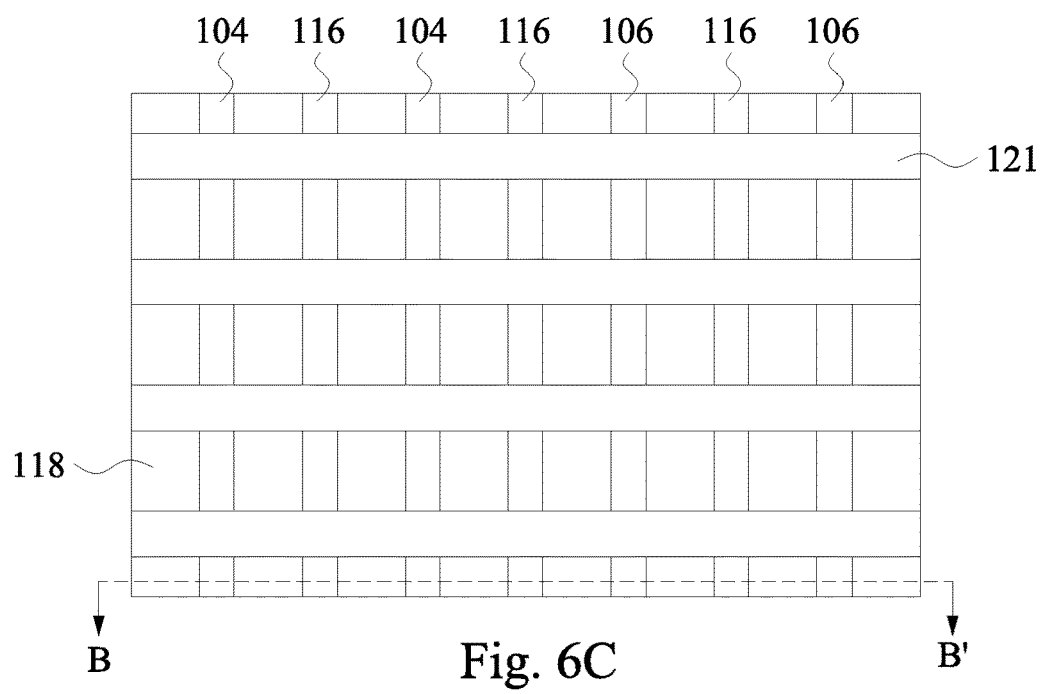

Referring to FIG. 1700, the method 1700 proceeds to operation 1712 by forming dummy gate structures, according to some embodiments. FIGS. 6A to 6C show that a number of dummy gate structures 121 are formed on the gate oxide layer 118 and over the active fin structures 104, the upper sections 106 of some of the active fin structures 104, the dummy fin structures 116, and the first dielectric layer 112. FIG. 6A is a 3D view of the exemplary structure. FIG. 6C is a top view of the exemplary structure. FIG. 6B is a cross sectional view of the structure along the B-B' line of the exemplary structure as illustrated by FIGS. 6A and 6C.

In some embodiments, as illustrated by FIG. 6C, the dummy gate structures 121 are formed in parallel and extend along a direction that is different from the direction of the active fin structures 104. In some embodiments, the dummy gate structures 121 include a poly gate electrode 120. In some embodiments, the dummy gate structures 121 further include an oxide hardmask 124 and a nitride hardmask 122. In some embodiments, the poly gate electrode 120 is made of poly silicon, the oxide hardmask 124 is made of $SiO_x$, and the nitride hardmask 122 is made of silicon nitride ($SiN_x$) or silicon carbon nitride (SiCN). In some embodiments, as illustrated by FIGS. 6A and 6B, the dummy gate structures 121 are formed over the top surface and the opposite side surfaces of the active fin structures 104, the upper sections 106 of some of the active fin structures 104, and the dummy fin structures 116. In some embodiments, the height of the poly gate electrode 120 is between about 100 nm and about 150 nm (e.g., between 100 nm and 150 nm). The width of the poly gate electrode 120 is between about 12 nm and about 16 nm (e.g., between 12 nm and 16 nm). In some embodiments, the thickness of the oxide hardmask 124 is between about 40 nm and about 80 nm (e.g., between 40 nm and 80 nm), and the thickness of the nitride hardmask 122 is between about 10 nm and about 30 nm (e.g., between 10 nm and 30 nm). In some embodiments, forming the dummy gate structures 121 includes depositing a stack of dummy gate materials including a gate electrode layer, a nitride hardmask layer, and an oxide hardmask layer, patterning the stack of dummy gate materials using lithography, and etching the stack of dummy gate materials to form the poly gate electrode 120, the nitride hardmask 122, and the oxide hardmask 124. In some embodiments, the etching of the stack of dummy gate materials stops on the surface of the gate oxide layer 118.

Figure 7A:
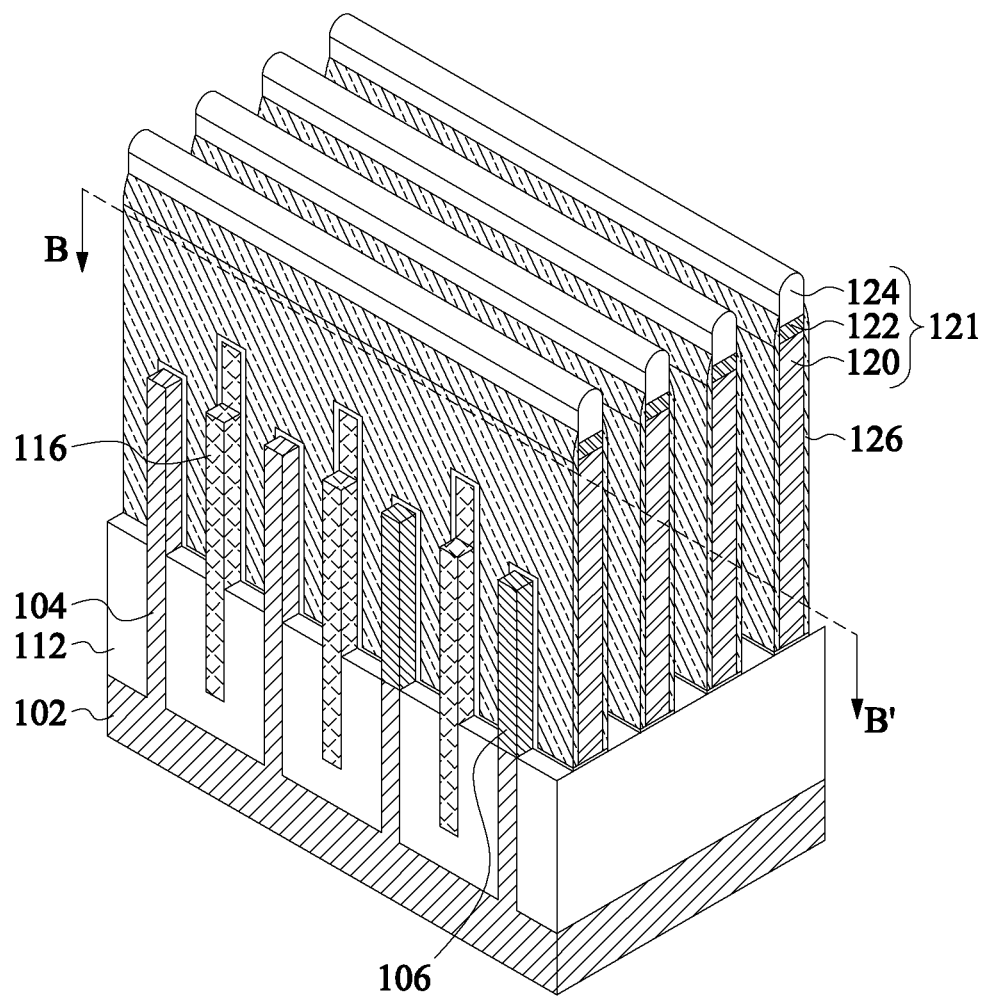
FIGS. 7A-7C are respective isometric, cross-sectional, and top-down views of a partially fabricated fin-based structure after recessing dummy fin structures, in accordance with some embodiments.
Figure 7B:
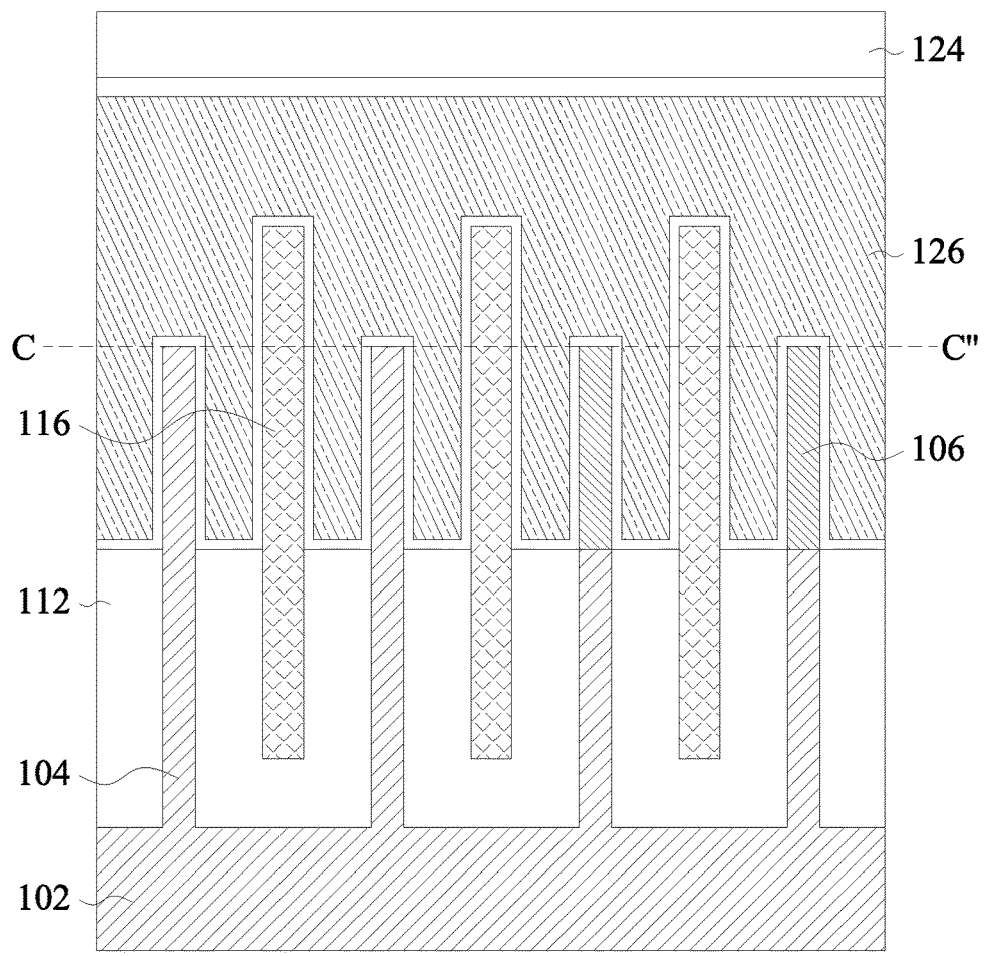
Figure 7C:
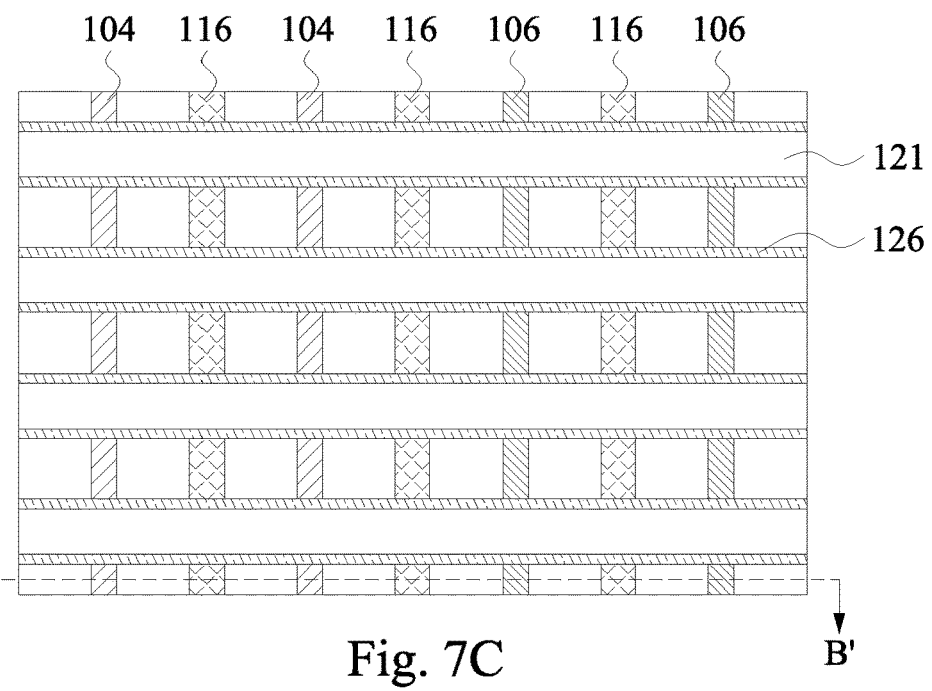

Referring to FIG. 1700, the method 1700 proceeds to operation 1714 by forming a spacer on the dummy gate structures and recessing the dummy fin structures in the areas not covered by the dummy gate structures or the spacer, according to some embodiments. FIGS. 7A to 7C show that a spacer 126 is formed on the side surfaces of the dummy gate structures 121. FIGS. 7A to 7C also show that dummy fin structures 116 are recessed at the areas not covered by the gate structures 121 or the spacer 126. FIG. 7A is a 3D view of the exemplary structure. FIG. 7C is a top view of the exemplary structure. FIG. 7B is a cross sectional view of the structure along the B-B' line of the exemplary structure as illustrated by FIGS. 7A and 7C.

In some embodiments, the spacer 126 is a low-k spacer with a dielectric constant less than 4.0. In some embodiments, the spacer 126 includes elements such as, for example, silicon (Si), oxygen (O), and carbon (C). In some embodiments, the thickness of the spacer 126 is between about 6 nm and about 8 nm (e.g., between 6 nm and 8 nm).

In some embodiments, forming the spacer 126 includes depositing a spacer 126 uniformly followed by pulling back the spacer 126 with an anisotropic etch (e.g., a dry etch) process. In some embodiments, pulling back the spacer 126 includes etching and removing the spacer 126 formed over the top surface of the dummy gate structures 121, the top surfaces of the active fin structures 104, the upper sections 106 of some of the active fin structures 104, the dummy fin structures 116, the top surface of the first dielectric layer 112, the side surfaces of the active fin structures 104, the upper sections 106 of some of the active fin structures 104, and the dummy fin structures 116. In some embodiments, pulling back the spacer 126 also includes etching a portion of the spacer 126 formed on the side surfaces of the dummy gate structures 121.

In some embodiments, recessing the dummy fin structures is performed with an anisotropic dry etch process. In some embodiments, the dry etch process etches the dummy fin material (e.g., metal oxides, SiON, and SiOCN) much faster than etching the active fin material (e.g., Si and SiGe). Due to this etch selectivity, the dry etch process recesses the dummy fin structures 116 vertically without recessing the active fin structures 104 or the upper sections 106 of some of the active fin structures 104. In some embodiments, as illustrated by FIGS. 7A and 7C, the dummy fin structures 116 are recessed so that the top surface of the dummy fin structures 116, the top surface of the active fin structures 104, and the top surface of the upper sections 106 of some of the active fin structures 104 are coplanar (e.g., align with the line C-C' in FIG. 7C).

In some embodiments, the dry etch process also removes the pad oxide layer 118 that are formed over the top surfaces and side surfaces of the active fin structures 104, the upper sections 106 of some of the active fin structures 104, and the dummy fin structures 116. In some embodiments, removing the pad oxide layer 118 formed over the top and side surfaces of the active fin structures 104 and the upper sections 106 of some of the active fin structures 104 is done so that epitaxy layers can be grown on the active fin structures 104 and the upper sections 106 in subsequent processes. In some embodiments, the dry etch process further removes the pad oxide layer 118 formed over the top surface of the first dielectric layer 112.

Figure 8A:
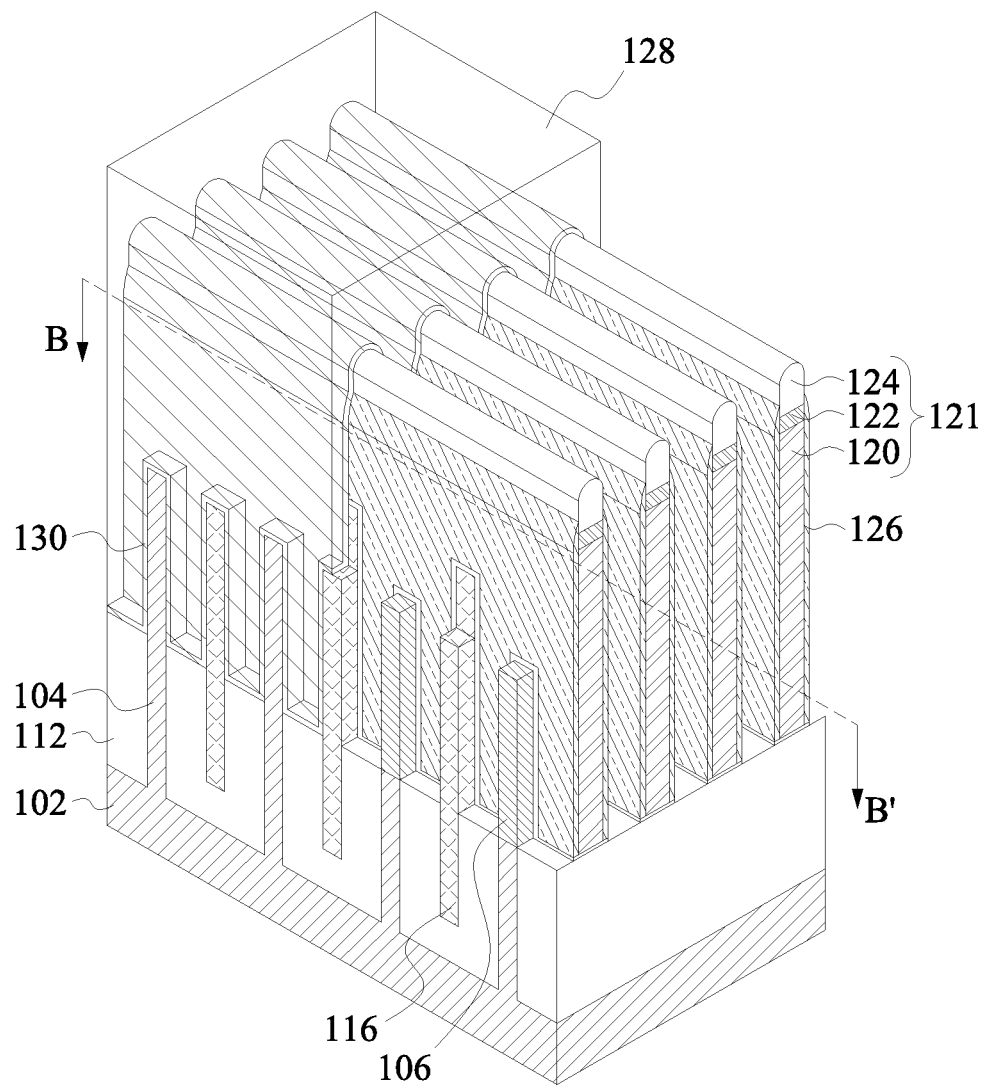
FIGS. 8A-8C are respective isometric, cross-sectional, and top-down views of a partially fabricated fin-based structure after patterning source/drain regions of p-type FinFET devices, in accordance with some embodiments.
Figure 8B:
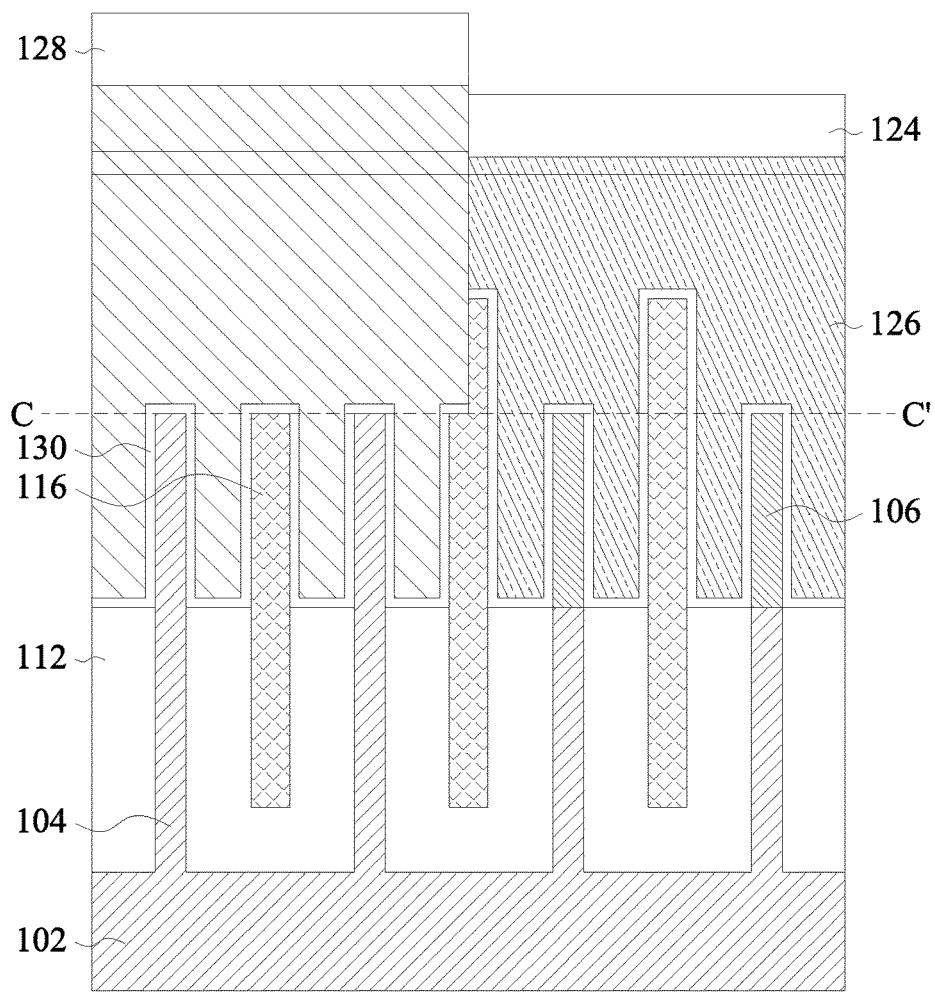
Figure 8C:
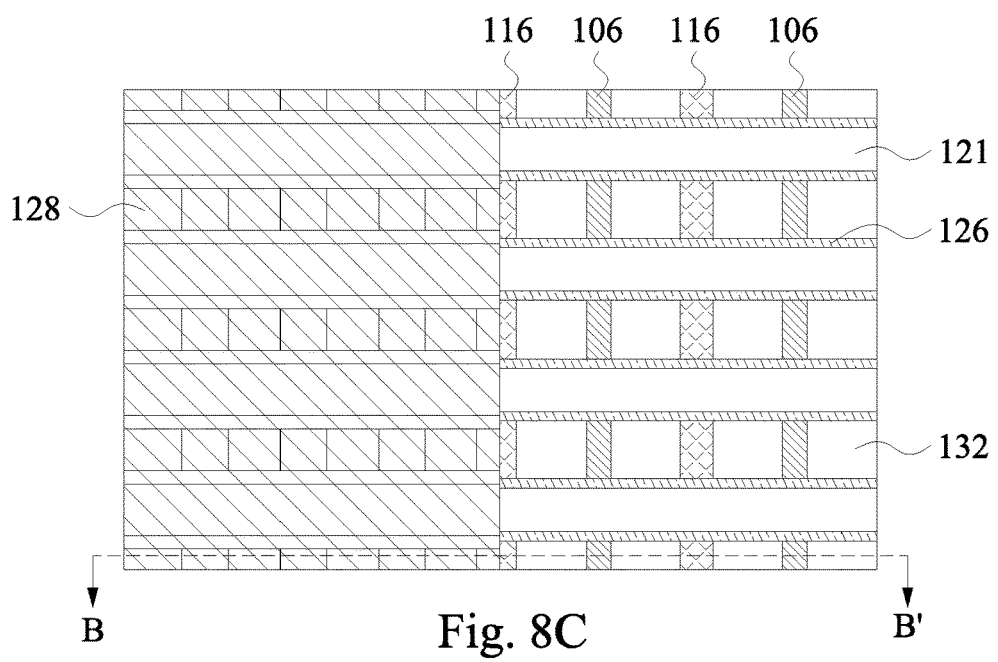

Referring to FIG. 1700, the method 1700 proceeds to operation 1716 by patterning the source/drain regions of p-type FinFET devices, according to some embodiments. FIGS. 8A to 8C show that a photoresist 128 is formed and patterned. FIGS. 8A to FIG. 8C also show that the photoresist 128 covers the active fin structures 104 without the upper sections 106 and the active fin structures 104 with the upper sections 106 are exposed. FIG. 8A is a 3D view of the exemplary structure. FIG. 8C is a top view of the exemplary structure. FIG. 8B is a cross sectional view of the structure along the B-B' line of the exemplary structure as illustrated by FIGS. 8A and 8C.

In some embodiments, as described in operation 1702, the upper sections 106 of some of the active fin structures 104 are doped with p-type dopants and are used in p-type FinFET devices, while other active fin structures 104 without the upper sections 106 are doped with n-type dopants and are used in n-type FinFET devices. In some embodiments, the areas of the active fin structures 104 and the upper sections of some of the active fin structures 104 that are not covered by the dummy gate structure 121 or the spacer 126 are the source/drain regions for the FinFET devices. In some embodiments, patterning the source/drain regions of the p-type FinFET devices includes depositing an aluminum oxide ($AlO_x$) layer 130 over the device structure, followed by coating a photoresist layer 128 over the $AlO_x$ layer 130. In some embodiments, the photoresist layer 128 is a positive tone resist with a thickness between about 200 nm and about 400 nm (e.g., between 200 nm and 400 nm). A portion of the photoresist layer 128 over the area of the active fin structures 104 with upper sections 106 doped with p-type dopants is then removed by a photolithography processes, and a portion of $AlO_x$ layer 130 under the portion of the photoresist layer 128 and over the area of the active fin structures 104 with upper sections 106 is also exposed. Next, an etch process is performed to remove the portion of $AlO_x$ layer 130 and expose the top surface and the side surfaces of the upper sections 106. In some embodiments, the etch process to remove the portion of $AlO_x$ layer 130 includes a wet etch process, a dry etch process, or a combination thereof.

Figure 9A:
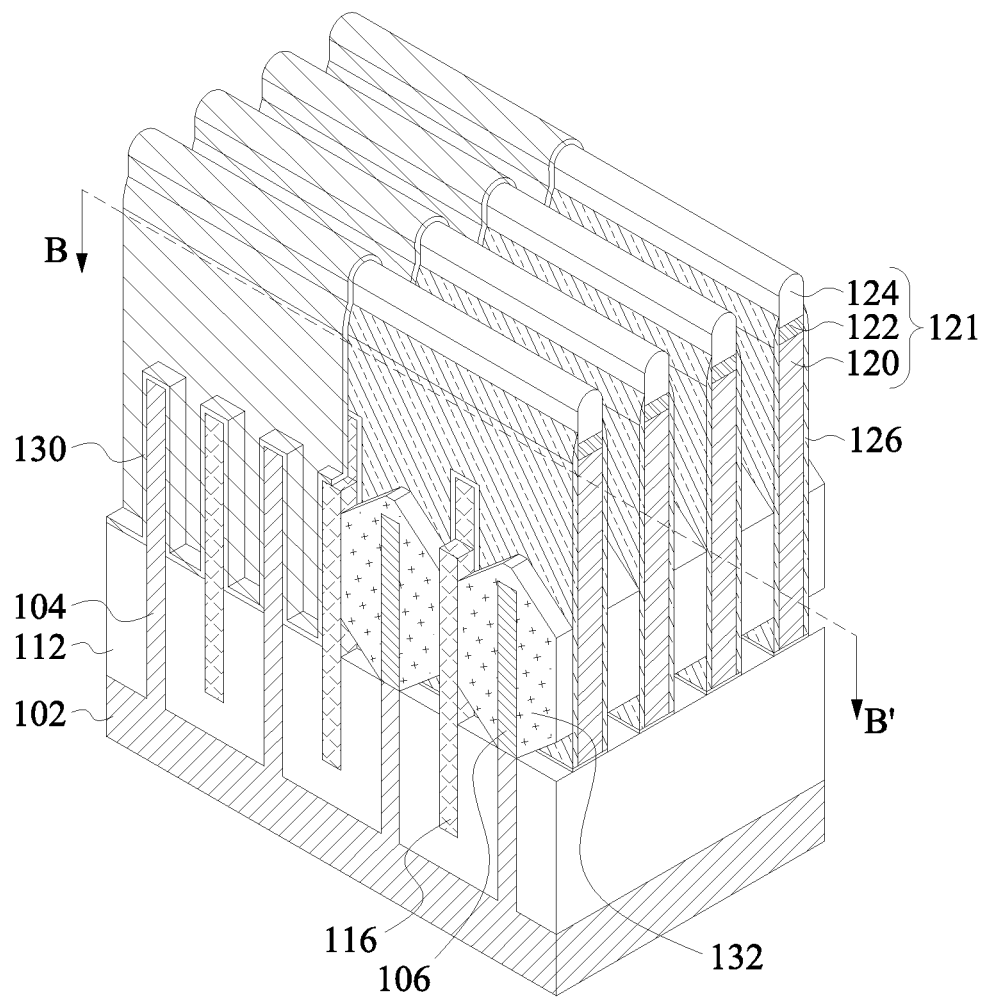
FIGS. 9A-9C are respective isometric, cross-sectional, and top-down views of a partially fabricated fin-based structure after epitaxy growth on source/drain regions of p-type FinFET devices, in accordance with some embodiments.
Figure 9B:
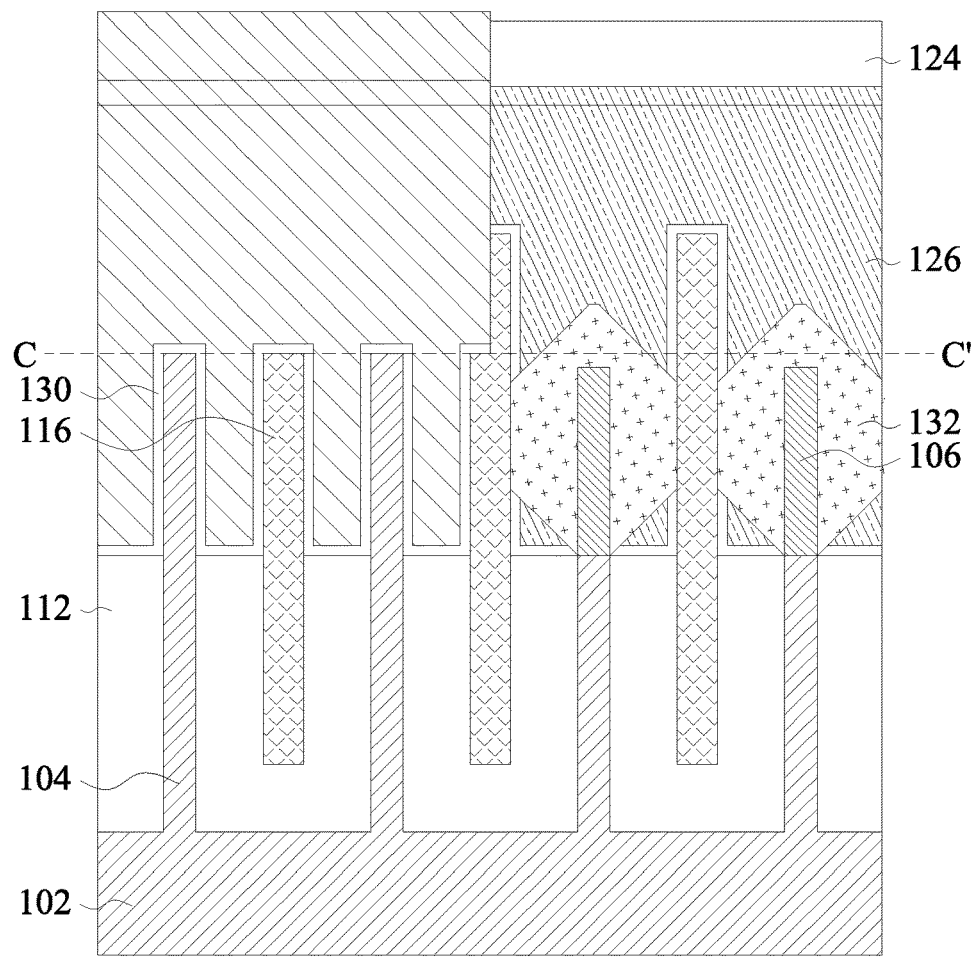
Figure 9C:
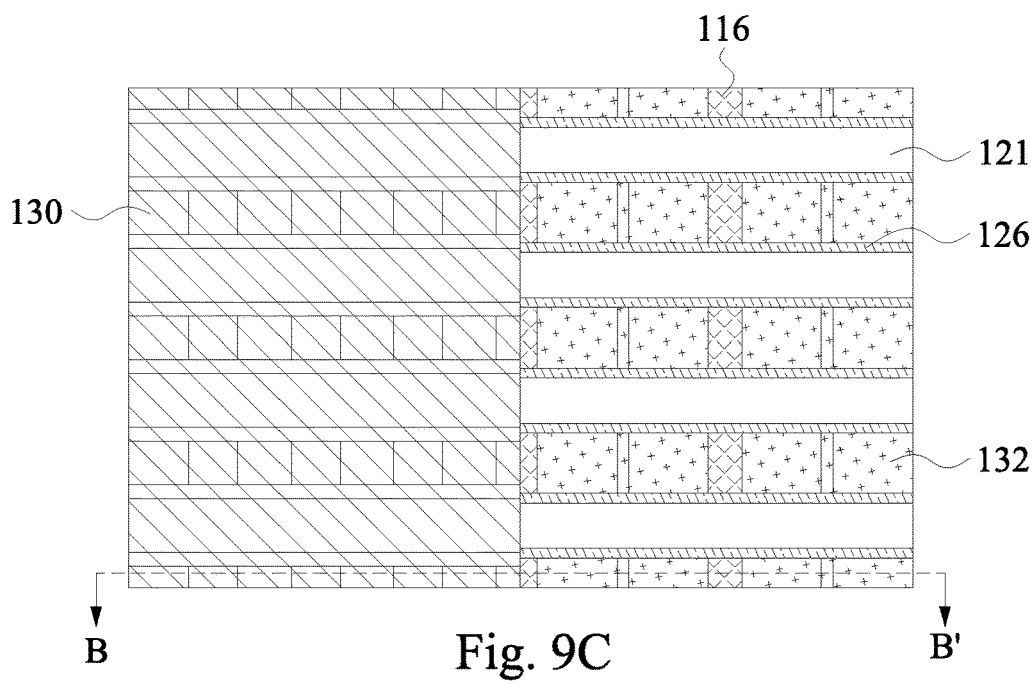

Referring to FIG. 1700, the method 1700 proceeds to operation 1718 by growing epitaxy layers on the source/drain regions of p-type FinFET devices, according to some embodiments. FIGS. 9A to 9C show that epitaxy layers 132 are formed on the upper sections 106 that are exposed at operation 1716 (e.g., the source/drain regions of p-type FinFET devices). FIG. 9A to FIG. 9C also show that the photoresist 128 are removed and the $AlO_x$ layer 130 covers the active fin structures 104 for the n-type FinFET devices. FIG. 9A is a 3D view of the exemplary structure. FIG. 9C is a top view of the exemplary structure. FIG. 9B is a cross sectional view of the structure along the B-B' line of the exemplary structure as illustrated by FIGS. 9A and 9C.

In some embodiments, before growing the epitaxy layers 132, the photoresist 128 are first removed by a photoresist stripping process (e.g., a wet chemical etch process). As a result, the $AlO_x$ layer 130 underneath the photoresist 128 is exposed, as illustrated by FIGS. 9A and 9B. In some embodiments, the purpose of the $AlO_x$ layer 130 is to protect the surface of the active fin structures 104 of the n-type FinFET devices during a subsequent epitaxy process.

In some embodiments, growing the epitaxy layers 132 on the source/drain regions of p-type FinFET devices includes performing a pre-clean process to remove the native oxide on the surface of the upper sections 106 of some of the active fin structures 104 and expose the surface of the upper sections 106. Next, an epitaxy process is performed to grow the epitaxy layers 132 on the surface of the upper sections 106 of some of the active fin structures 104. In some embodiments, the epitaxy process is an SiGe epitaxy process performed at a temperature between about 400° C. and about 500° C. (e.g., between 400° C. and 500° C.). The epitaxy process is a selective process that only grows the epitaxy layer 132 on the surface of the upper sections 106 that is exposed (e.g., the source/drain regions of the p-type FinFET devices). In some embodiments, the epitaxy layer 132 is a SiGe layer with a Ge concentration between about 40% and about 60% (e.g., between 40% and 60%). In some embodiments, the thickness of the epitaxy layers 132 is between about 10 nm and about 20 nm (e.g., between 10 nm and 20 nm). In some embodiments, the shape of the epitaxy layers 132 is a diamond like shape. The epitaxy layers 132 can also take different shapes depending on different factors such as, for example, the epitaxy process condition, the crystalline orientation of the upper sections 106 of the active fin structures 104, and the materials of the upper sections 106 of the active fin structures 104. In some embodiments, the epitaxy layer 132 is doped with boron (B) during the epitaxy process. In some embodiments, the epitaxy layer 132 is thick enough to touch the side surfaces of the dummy fin structures 116. In some embodiments, the dummy fin structures 116 acts as a self-aligned insulation layer to avoid the epitaxy layers 132 formed on adjacent upper sections 106 touching each other.

Figure 10A:
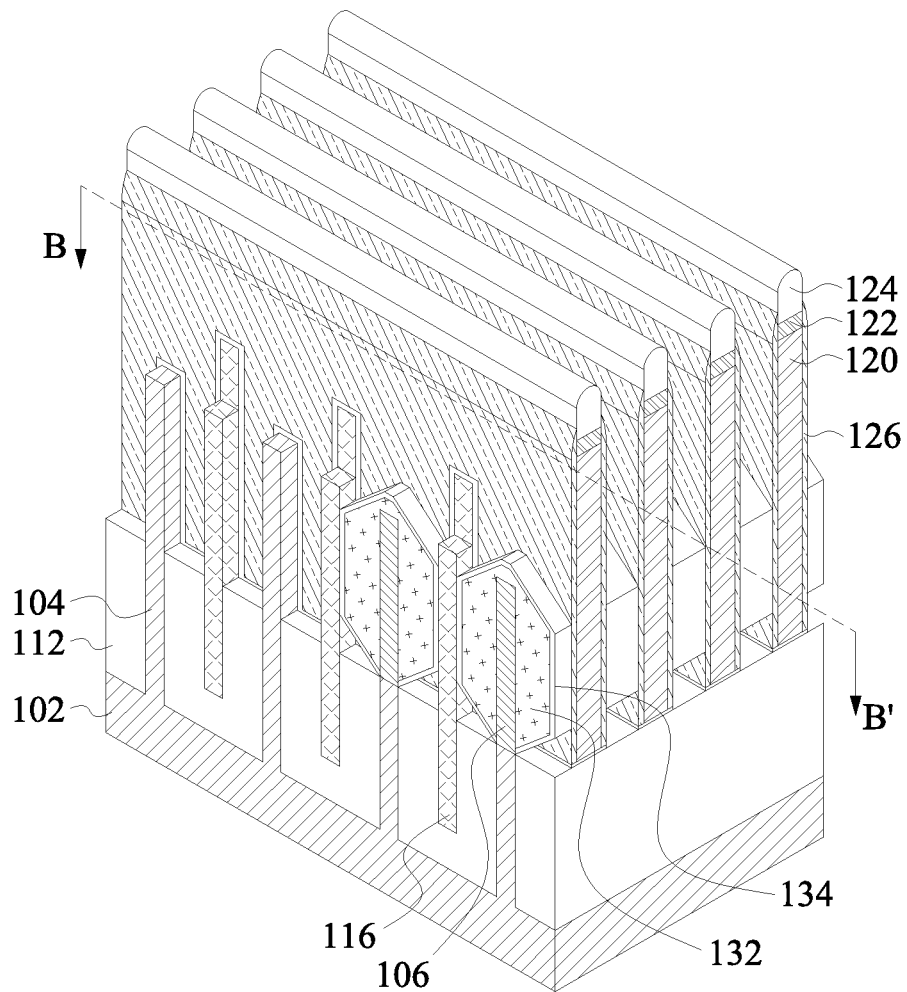
FIGS. 10A-10C are respective isometric, cross-sectional, and top-down views of a partially fabricated fin-based structure after growth of a germanium-containing oxide layer on epitaxy layers on source/drain regions of p-type FinFET devices, in accordance with some embodiments.
Figure 10B:
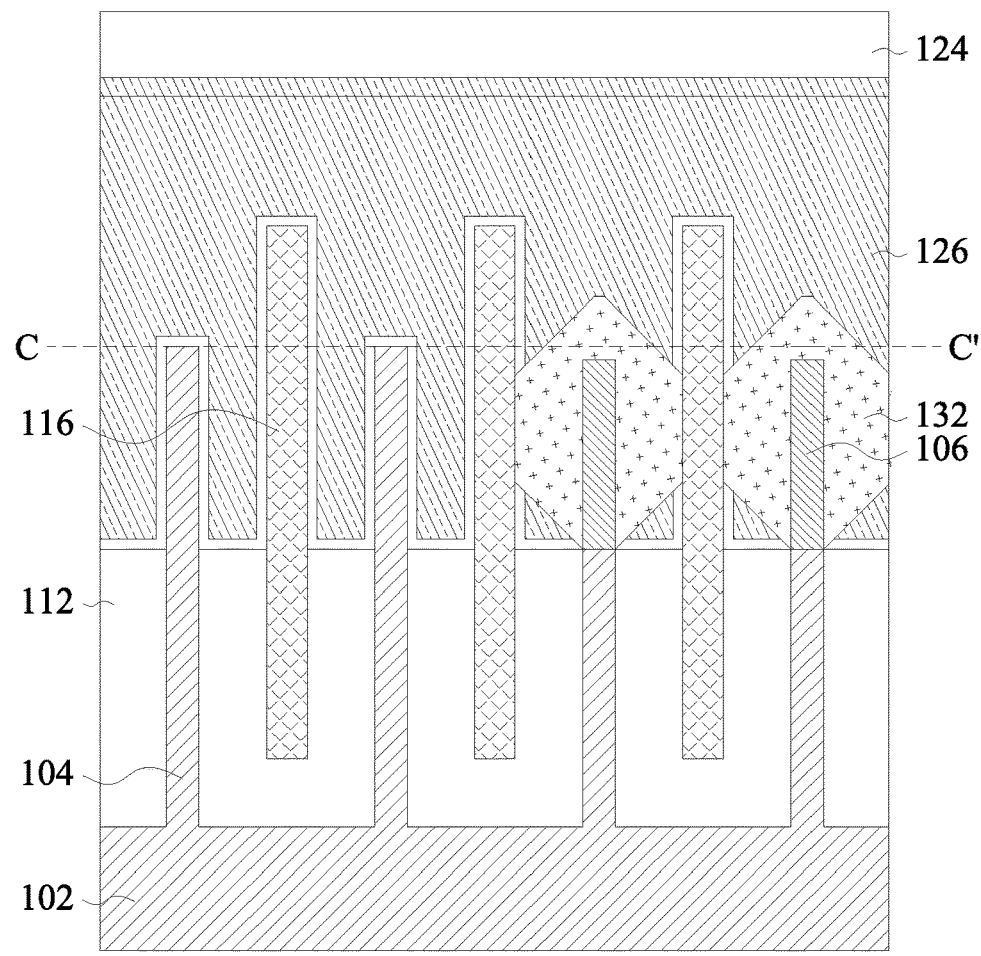
Figure 10C:
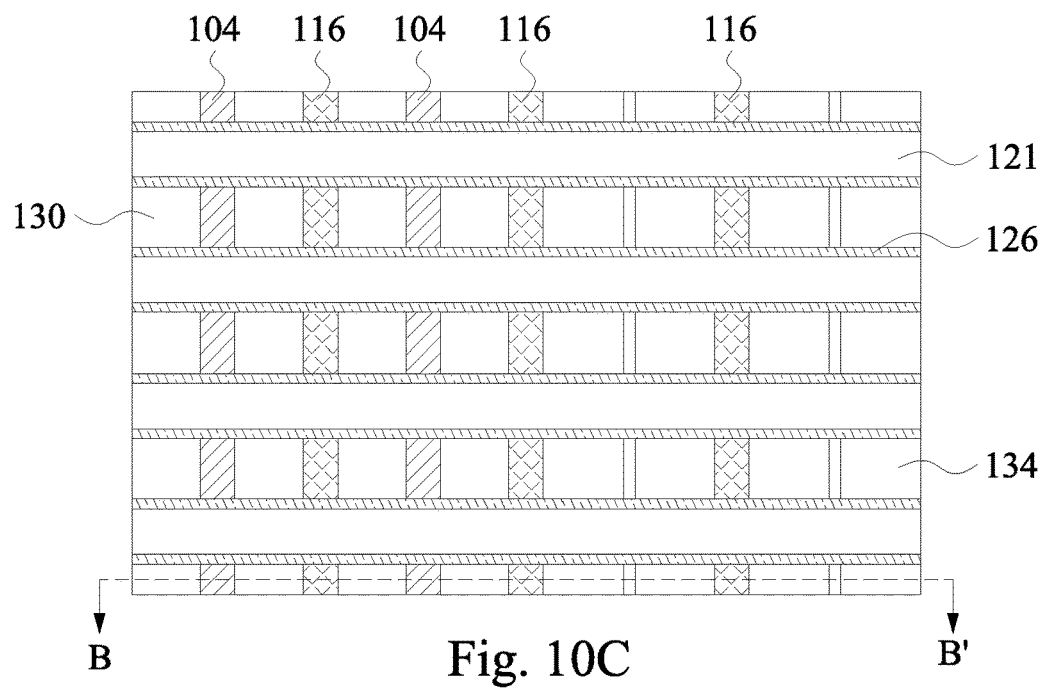

Referring to FIG. 1700, the method 1700 proceeds to operation 1720 by growing a Ge containing oxide layer on the epitaxy layers on the p-type FinFET devices, according to some embodiments. FIGS. 10A to 10C show that a Ge containing oxide layer 134 is formed on the epitaxy layers 132 that are formed on the source/drain regions of the p-type FinFET devices. FIGS. 10A to 10C also show that the $AlO_x$ layer 130 that covers the active fin structures 104 for the n-type FinFET devices is removed. FIG. 10A is a 3D view of the exemplary structure. FIG. 10C is a top view of the exemplary structure. FIG. 10B is a cross sectional view of the structure along the B-B' line of the exemplary structure as illustrated by FIGS. 10A and 10C.

In some embodiments, growing the Ge containing oxide layer 134 on the epitaxy layers 132 is performed by using a room temperature process with oxidizing chemicals. In some embodiments, the room temperature process uses ozone (O3), a sulfuric acid ($H_2SO_4$) and hydrogen peroxide ($H_2O_2$) mixture, or an ammonia hydroxide ($NH_4OH$) and hydrogen peroxide ($H_2O_2$) mixture. In some embodiments, growing the Ge containing oxide layer 134 on the epitaxy layers 132 is performed by using a low temperature wet steam furnace anneal. In some embodiments, the low temperature wet steam furnace anneal is performed at a temperature between about 300° C. and about 400° C. (e.g., between 300° C. and 400° C.). An advantage of using the low temperature wet steam furnace anneal is that the low temperature wet steam furnace anneal can grow a thicker Ge containing oxide layer than the room temperature process.

In some embodiments, the Ge containing oxide layer 134 is a silicon germanium oxide ($SiGeO_x$) layer. In some embodiments, the Ge concentration of the Ge containing oxide layer 134 is between about 40% and about 70% (e.g., between 40% and 70%). In some embodiments, the Ge containing oxide layer 134 has a thickness between about 1 nm and about 3 nm (e.g., between 1 nm and 3 nm). In some embodiments, the Ge containing oxide layer 134 completely covers the surface of the epitaxy layers 132. In some embodiments, the Ge containing oxide layer 134 contacts the side surface of the dummy fin structures 116. In some embodiments, the Ge containing oxide layer 134 acts as a protection layer for the epitaxy layers 132 in a subsequent epitaxy process so that no additional epitaxy layer is grown on the epitaxy layers 132. The Ge containing oxide layer 134 withstands a pre-clean process of the subsequent epitaxy process and stays on the epitaxy layers 132 after the pre-clean process. In some embodiments, the pre-clean process includes a remote plasma etching process using hydrogen containing and fluorine containing chemicals such as, for example, hydrogen ($H_2$), ammonia ($NH_3$), and nitrogen fluoride ($NF_3$). In some embodiments, a high Ge concentration (e.g., between about 40% and about 70%) in the Ge containing oxide layer 134 makes the Ge containing oxide layer 134 resistant in the pre-clean process of the subsequent epitaxy process.

In some embodiments, the $AlO_x$ layer 130 that covers the active fin structures 104 for the n-type FinFET devices is removed after growing the Ge containing oxide layer 134 on the epitaxy layers 132. In some embodiments, the $AlO_x$ layer 130 is removed to expose the surfaces of the active fin structures 104 of the n-type FinFET devices for a subsequent epitaxy process to grow epitaxy layers on the active fin structures of the n-type FinFET devices. In some embodiments, the process to remove the $AlO_x$ layer 130 includes a wet etch process, a dry etch process, or a combination thereof.

Figure 11A:
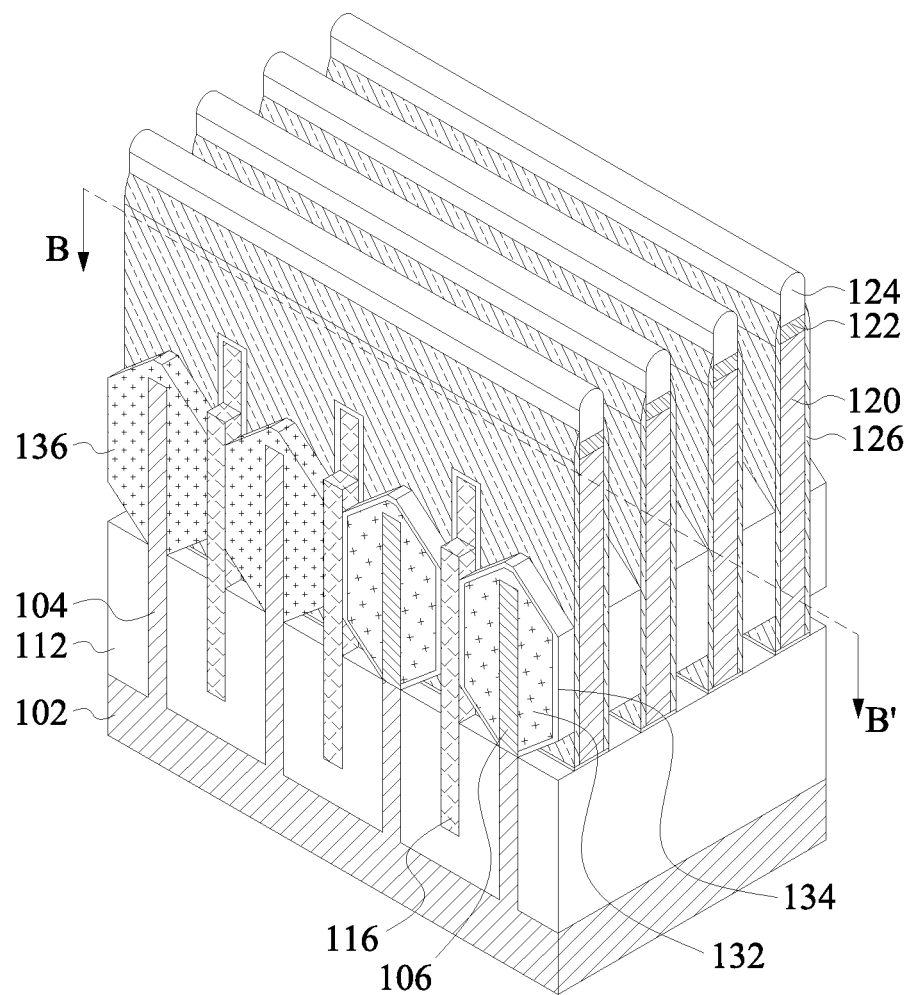
FIGS. 11A-11C are respective isometric, cross-sectional, and top-down views of a partially fabricated fin-based structure after epitaxy growth on source/drain regions of n-type FinFET devices, in accordance with some embodiments.
Figure 11B:
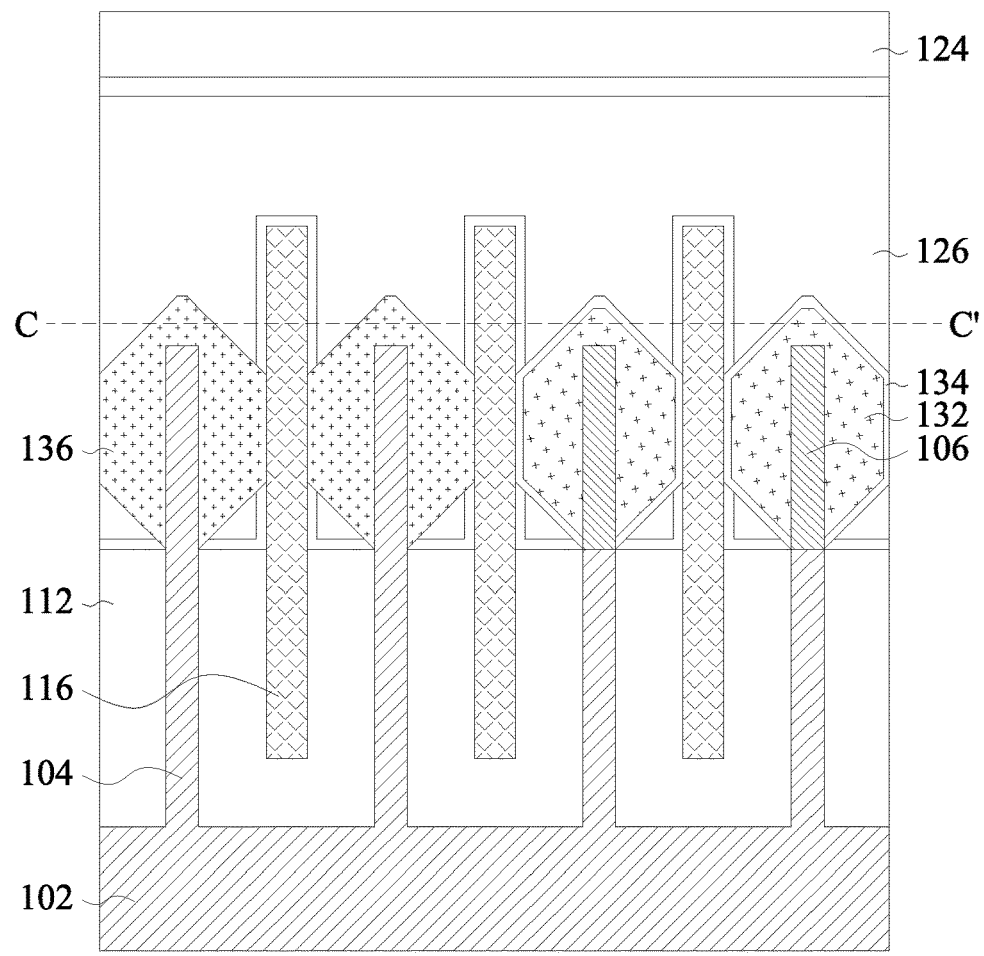
Figure 11C:
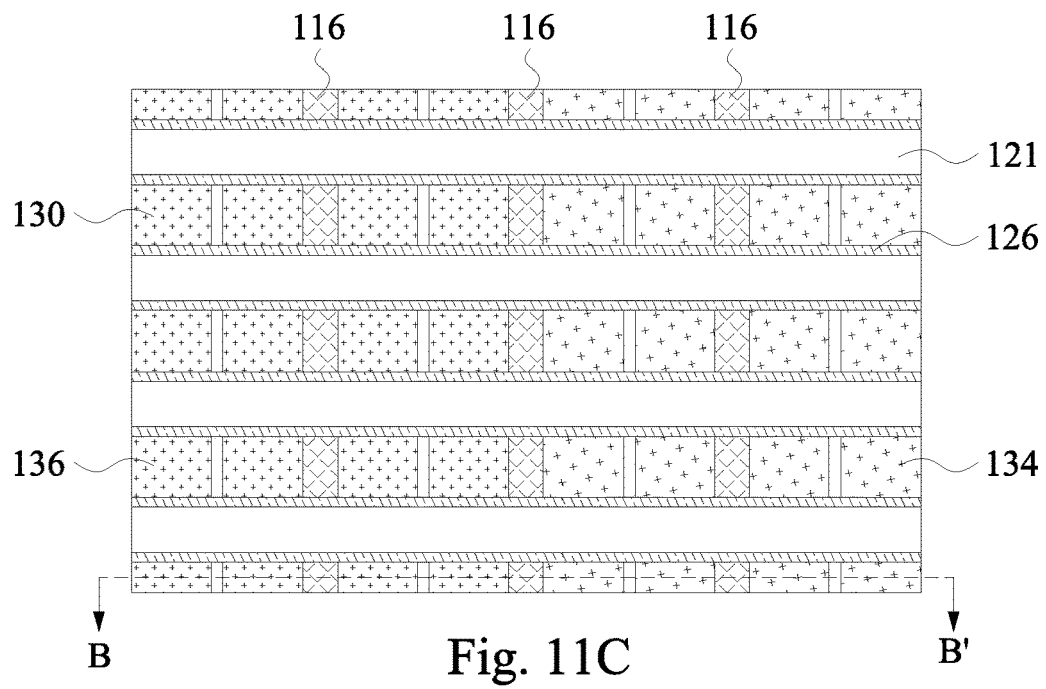

Referring to FIG. 1700, the method 1700 proceeds to operation 1722 by growing self-aligned epitaxy layers on the source/drain regions of n-type FinFET devices, according to some embodiments. FIGS. 11A to 11C show that self-aligned epitaxy layers 136 are formed on the source/drain regions of the n-type FinFET devices (e.g., the surface of the active fin structures 104 that are not covered by the dummy gate structures 121 or the spacer 126 for the n-type FinFET devices). FIG. 11A is a 3D view of the exemplary structure. FIG. 11C is a top view of the exemplary structure. FIG. 11B is a cross sectional view of the structure along the B-B' line of the exemplary structure as illustrated by FIGS. 11A and 11C.

In some embodiments, growing the self-aligned epitaxy layers 136 on the source/drain regions of n-type FinFET devices includes performing a pre-clean process to remove the native oxide on the surface of the active fin structures 104 for the n-type FinFET devices and expose the surface of active fin structures 104. In some embodiments, the pre-clean process includes a remote plasma etching process using hydrogen containing and fluorine containing chemicals such as, for example, hydrogen ($H_2$), ammonia ($NH_3$), and nitrogen fluoride ($NF_3$). In some embodiments, the Ge containing oxide layer 134 withstands the preclean process and stays on the surface of the epitaxy layers 132 on the source/drain regions of the p-type FinFET devices. Next, a self-aligned epitaxy process is performed to grow the epitaxy layers 136 on the surface of the active fin structures 104 without growing additional epitaxy layers on the epitaxy layers 132.

In some embodiments, the existence of the Ge containing oxide layer 134 on the source/drain regions of the p-type FinFET devices after the pre-clean process enables the self-aligned epitaxy process to perform in a self-aligned manner. Specifically, because the Ge containing oxide layer 134 withstands the pre-clean process of the self-aligned epitaxy process, the Ge containing oxide layer 134 acts as a protection layer of the epitaxy layers 132 to prevent an additional epitaxy layer to be grown on the epitaxy layers 132 during the self-aligned epitaxy process. Consequently, there is no need to perform additional lithography or patterning steps to form another protection layer (e.g., an additional $AlO_x$ layer) to protect the epitaxy layers 132 during the epitaxy process for the n-type FinFET devices. The usage of the Ge containing oxide layer 134 simplifies the process integration and enables the growth of self-aligned epitaxy layers 136 without additional patterning steps.

Figure 12A:
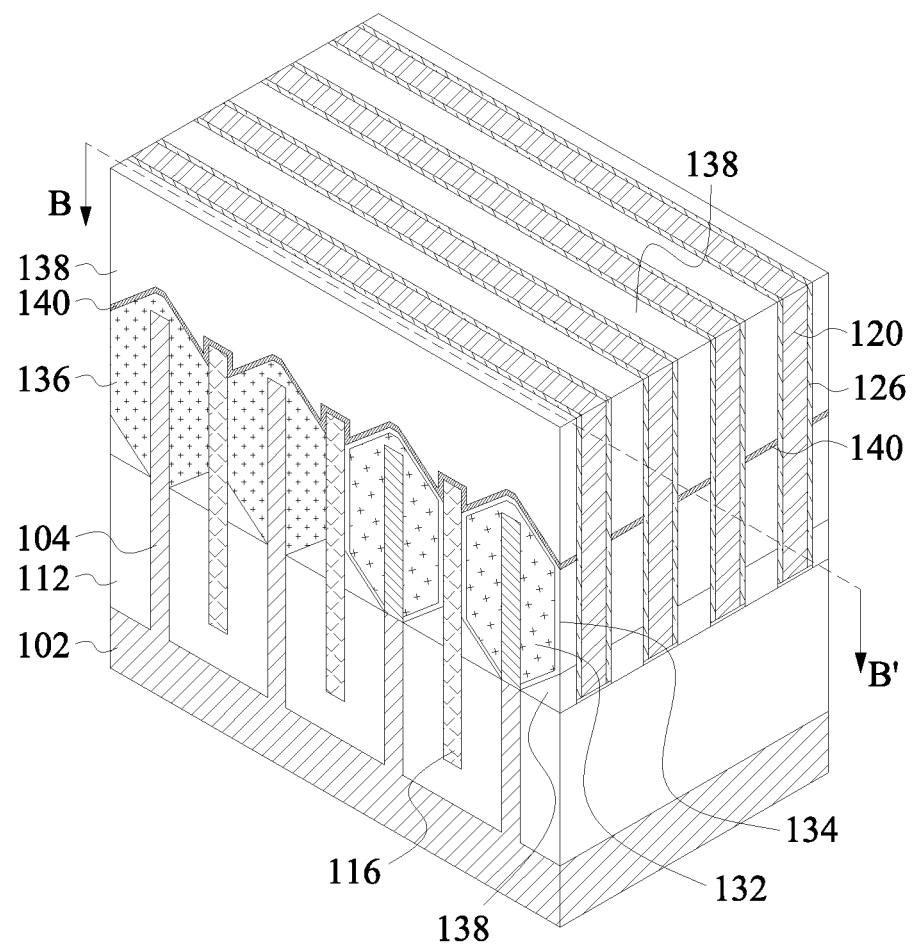
FIGS. 12A-12C are respective isometric, cross-sectional, and top-down views of a partially fabricated fin-based structure after another dielectric layer formation, in accordance with some embodiments.
Figure 12B:
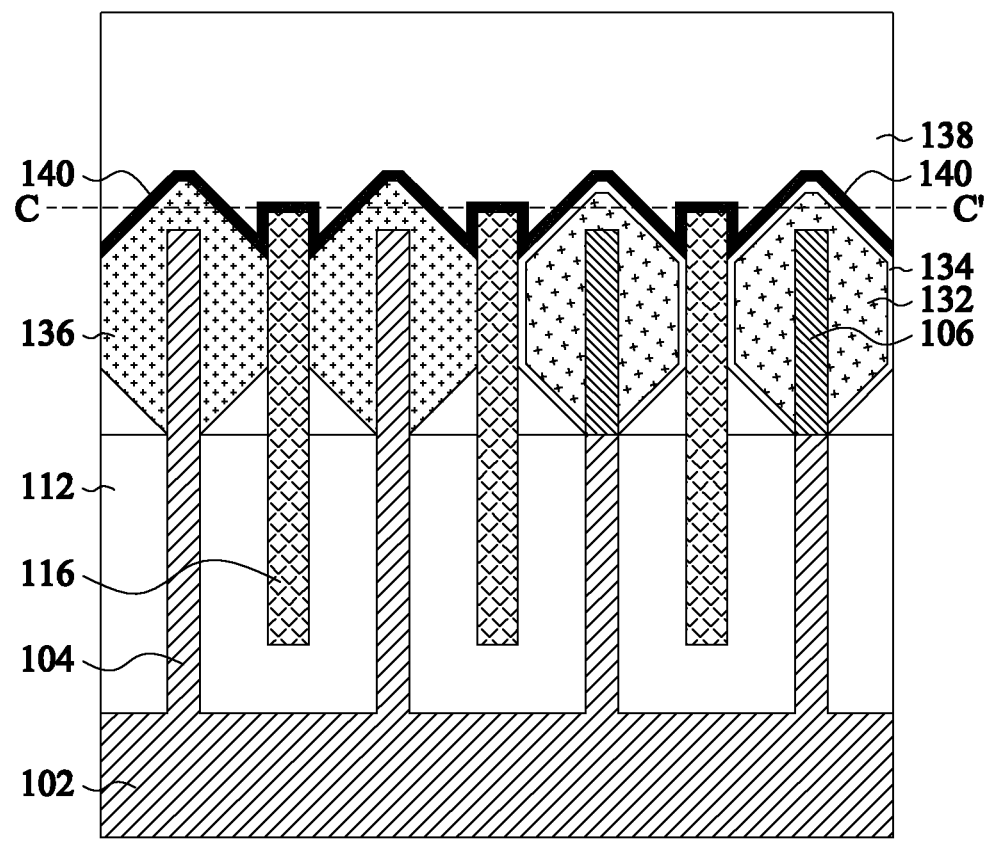
Figure 12C:
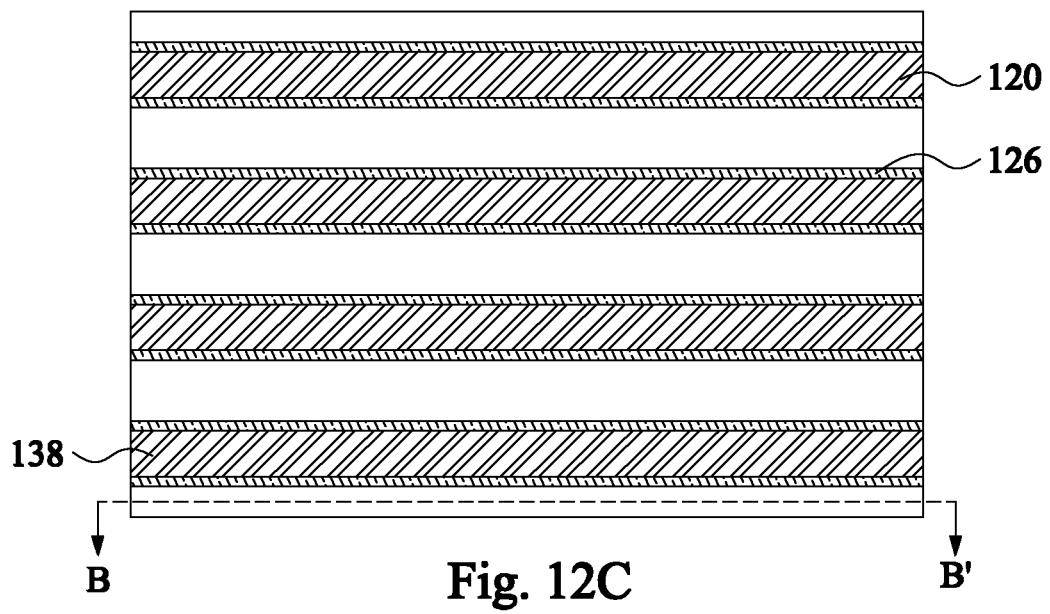

Referring to FIG. 1700, the method 1700 proceeds to operation 1724 by forming a second dielectric layer, according to some embodiments. FIGS. 12A to 12C show that a second dielectric layer 138 is formed between the dummy gate structures 121 (e.g., the poly gate electrodes 120) and on the upper surface of the first dielectric layer 112. FIGS. 12A to 12C also show that a contact etch stop layer (CESL) 140 is formed on the epitaxy layers 136 of the n-type FinFET devices and the Ge containing oxide layer 134 on the epitaxy layers 132 of the p-type FinFET devices. Further, FIGS. 12A to 12C show that the oxide hardmask 124 and the nitride hardmask 122 of the dummy gate structures 121 are removed, and that the upper surfaces of the second dielectric layer 138 and the poly gate electrodes 120 are coplanar. FIG. 12A is a 3D view of the exemplary structure. FIG. 12C is a top view of the exemplary structure. FIG. 12B is a cross sectional view of the structure along the B-B' line of the exemplary structure as illustrated by FIGS. 12A and 12C.

In some embodiments, the second dielectric layer 138 is an oxide (e.g., $SiO_x$) layer. In some embodiments, the second dielectric layer 138 is deposited with a CVD process, an ALD process, or a spin-on process. In some embodiments, an additional anneal process performed at a temperature between about 400° C. and about 600° C. (e.g., between 400° C. and 600° C.) is used to treat the second dielectric layer 138 to densify the as-deposited dielectric layer. In some embodiments, after depositing the second dielectric layer 138, a planarization process (e.g., CMP) is performed to remove a portion of the second dielectric layer 138 formed over the top surface of the dummy gate structures 121 and planarize the top surface of the second dielectric layer 138 so that the top surfaces of the second dielectric layer 138, the spacer 126, and the poly gate electrode 120 are coplanar. In some embodiments, the oxide hardmask 124 and the nitride mask 122 are also removed during the planarization process or during an additional etch process, so that the top surface of the poly gate electrodes 120 is exposed. In some embodiments, after the planarization process, the height of the poly gate electrode 120 is between about 80 nm and about 130 nm (e.g., between 80 nm and 130 nm).

In some embodiments, the CESL 140 is deposited before depositing the second dielectric layer 138. In some embodiments, the CESL 140 is deposited to protect the epitaxy layers 136 and the epitaxy layers 132 against moisture, dopants, and/or oxidation during subsequent deposition and anneal processes of the second dielectric layer 138. In some embodiments, the CESL 140 acts as a etch stop layer for the contact etch to stop on so that the epitaxy layers below the CESL 140 are not damaged by the contact etch. In some embodiments, the CESL 140 is a silicon nitride ($SiN_x$) layer. In some embodiments, depositing the CESL 140 is performed using an ALD process or a CVD process.

Figure 13A:
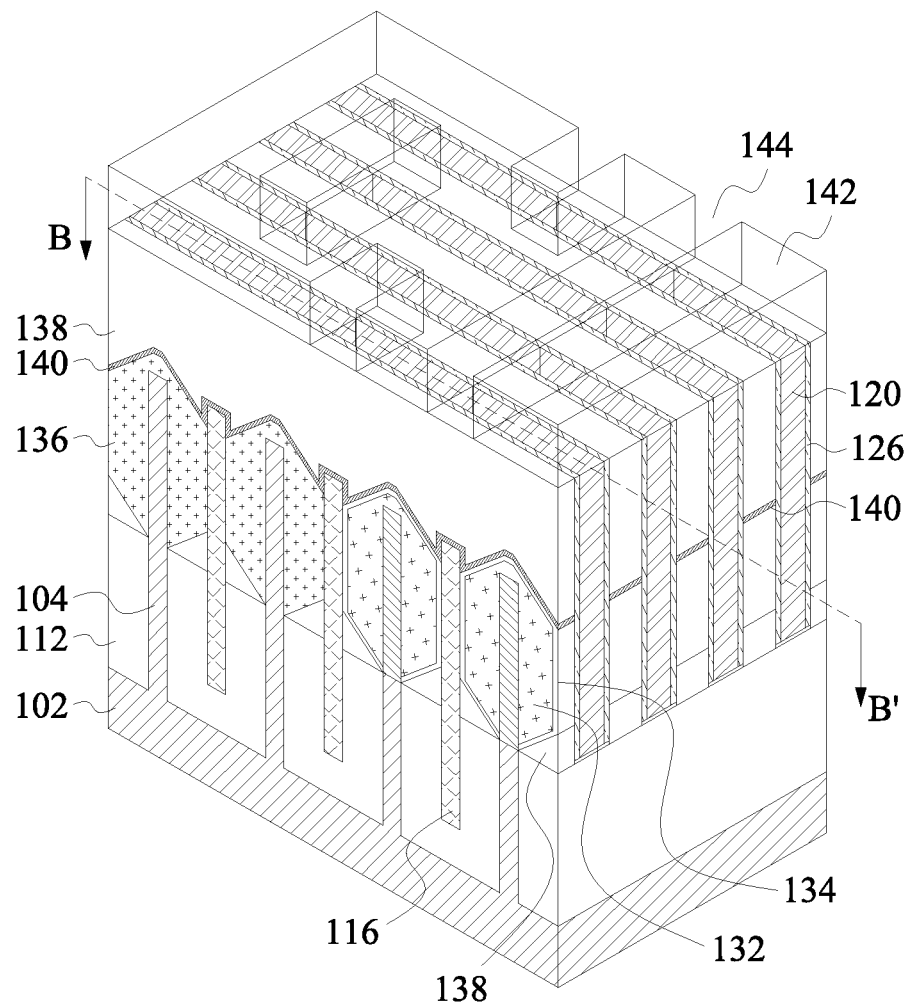
FIGS. 13A-13C are respective isometric, cross-sectional, and top-down views of a partially fabricated fin-based structure after a self-aligned etch of dummy gate structures and dummy fin structures, in accordance with some embodiments.
Figure 13B:
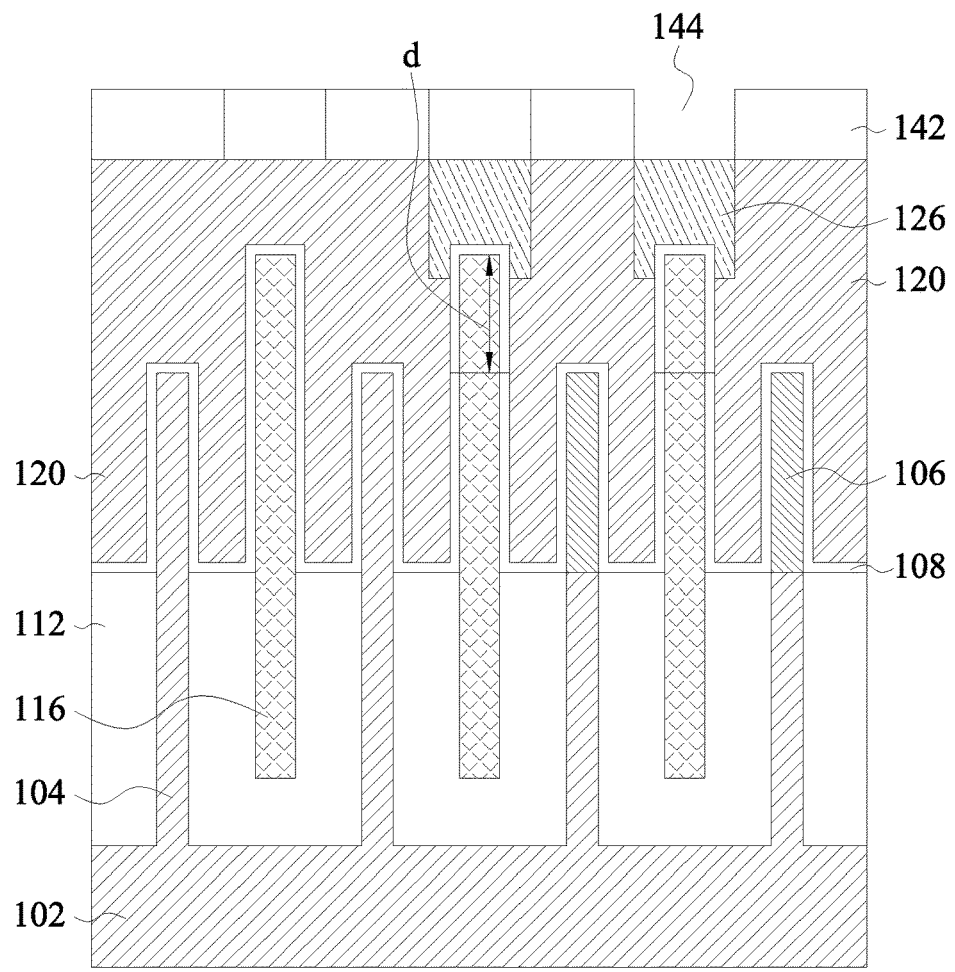
Figure 13C:
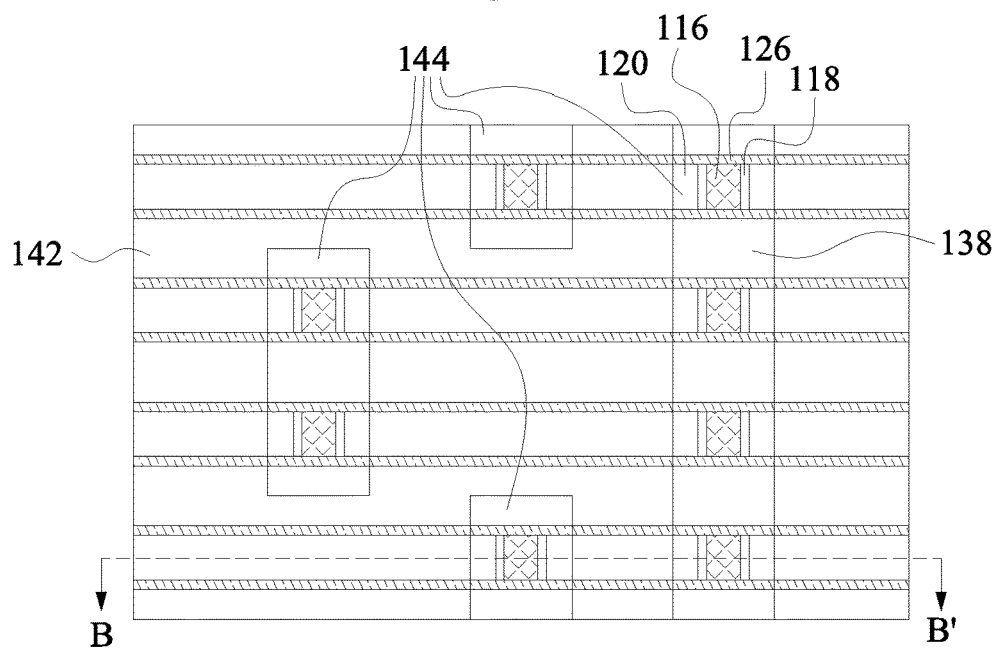

Referring to FIG. 1700, the method 1700 proceeds to operation 1726 by performing a self-aligned etch to recess the dummy gate structures and the dummy fin structures, according to some embodiments. FIGS. 13A to 13C show that a photoresist layer 142 with openings 144 is formed over the second dielectric layer 138 and the poly gate electrodes 120. FIG. 13C also shows that a self-aligned etch is performed to etch the poly gate electrode 120 and the dummy fin structures 116 through the openings 144. FIG. 13A is a 3D view of the exemplary structure. FIG. 13C is a top view of the exemplary structure. FIG. 13B is a cross sectional view of the structure along the B-B' line of the exemplary structure as illustrated by FIGS. 13A and 13C.

In some embodiments, before performing the self-aligned etch, a photoresist layer 142 is coated on the top surfaces of the second dielectric layer 138 and the poly gate electrodes 120. Next, the photoresist layer 142 is patterned to form openings 144 to define the areas to be recessed by the subsequent self-aligned etch. In some embodiments, the photoresist layer 142 is a positive tone photoresist. In some embodiments, the photoresist layer 142 has a thickness between about 50 nm and about 100 nm (e.g., between 50 nm and 100 nm).

In some embodiments, the self-aligned etch is an anisotropic etch (e.g., a dry etch) process. In some embodiments, the self-aligned etches the poly gate electrodes 120 and the dummy fin structures 116 underneath the poly gate electrodes 120 exposed by the openings 144. In some embodiments, the openings 144 is wider than the dummy fin structures 116 in the B-B' direction, as illustrated by FIG. 13C. In some embodiments, the self-aligned etch has higher (e.g., more than 10 times higher) etch rates for the poly gate electrodes 120 and the dummy fin structures 116 than the etch rates for the spacer 126 and the second dielectric layer 138. Due to the etch rate differences, the etch recesses the poly gate electrodes 120 and the dummy fin structures 116 under the openings 144, while the etch recesses minimal amount of the spacers 126 and the second dielectric layer 138. The etch is directed to the targeted materials even if other materials are exposed by the lithography patterns. Thus, there is no need to accurately align the boundaries of the lithography pattern with the underlying structures, which provides an increased margin for the alignment and overlay requirements in the lithography processes. In other words, the etch is a self-aligned etch.

In some embodiments, the dummy fin structures 116 underneath the poly gate electrodes 120 are recessed by a depth d. The depth d can be between about 20 nm and about 40 nm (e.g., between 20 nm and 40 nm). In some embodiments, the dummy fin structures 116 are recessed by a depth d of more than about 40 nm. In some embodiments, the dummy fin structures 116 are recessed by a depth d less than about 20 nm. The exact recessed amount of the dummy fin structures 116 depends on the actual device design.

Figure 14A:
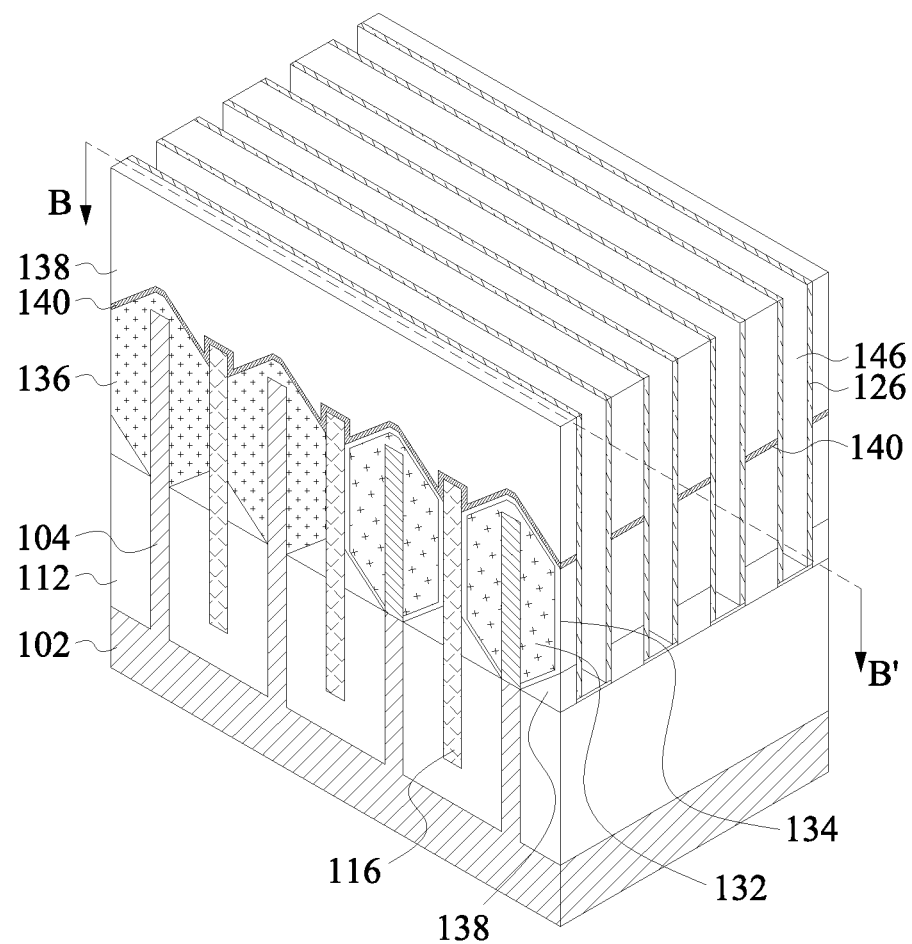
FIGS. 14A-14C are respective isometric, cross-sectional, and top-down views of a partially fabricated fin-based structure after removal of dummy gate structures, in accordance with some embodiments.
Figure 14B:
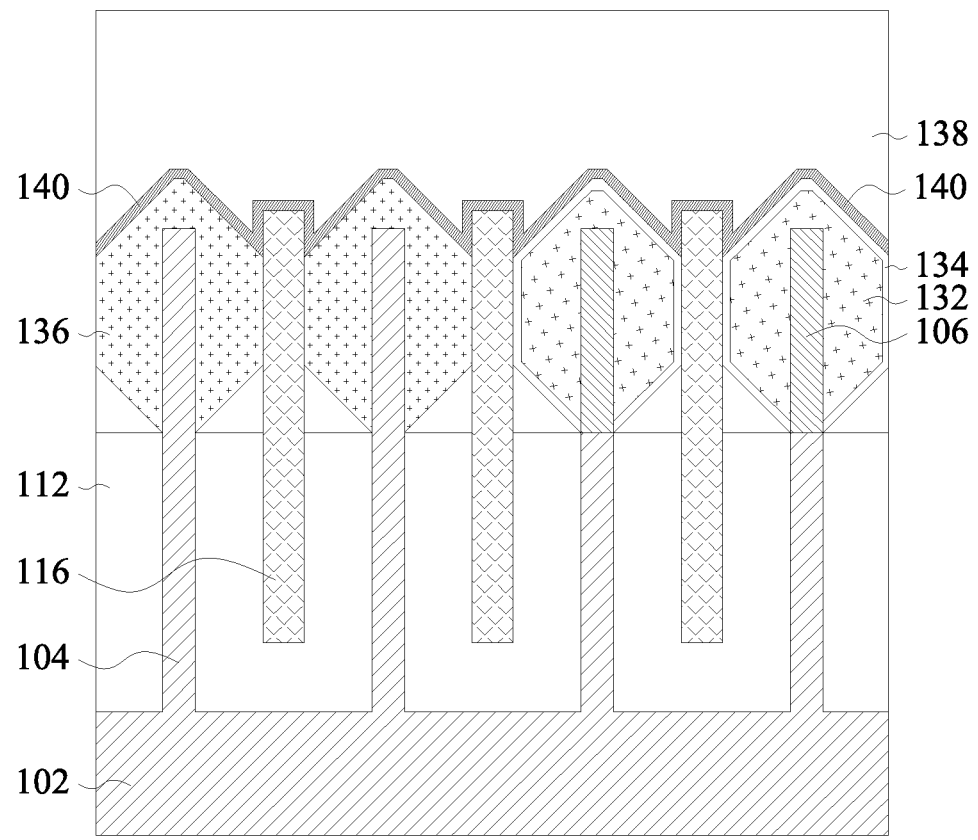
Figure 14C:
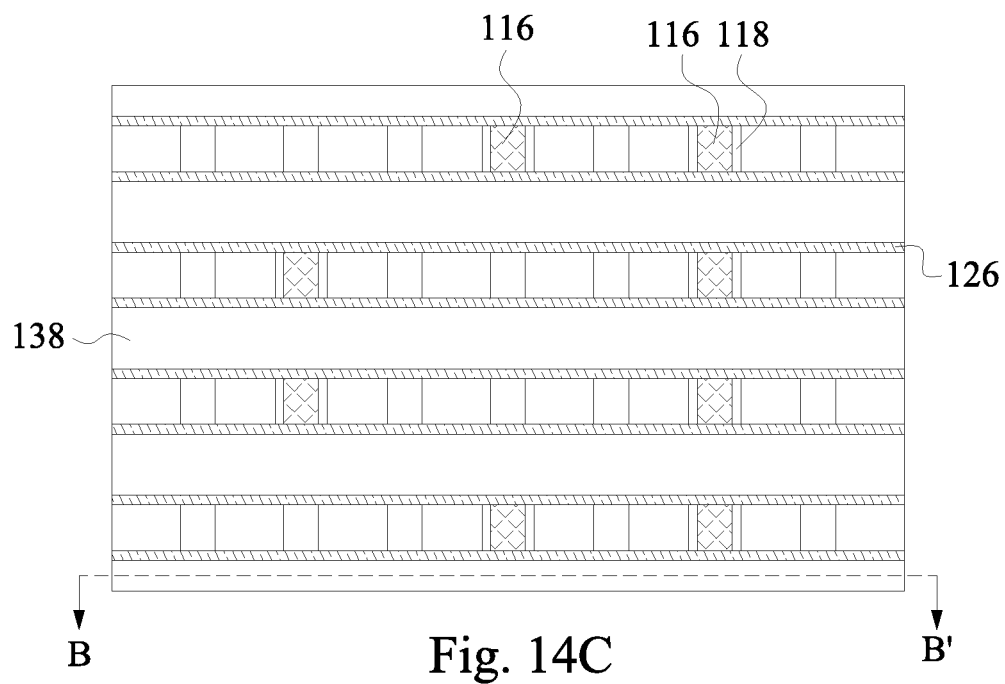

Referring to FIG. 1700, the method 1700 proceeds to operation 1728 by removing the dummy gate structures, according to some embodiments. FIGS. 14A to 14C show that the dummy gate structures (e.g., the poly gate electrodes 120) are removed. FIG. 14A is a 3D view of the exemplary structure. FIG. 14C is a top view of the exemplary structure. FIG. 14B is a cross sectional view of the structure along the B-B' line of the exemplary structure as illustrated by FIGS. 14A and 14C.

In some embodiments, removing the dummy gate structures is performed using a dry etch, a wet etch, or a combination thereof. In some embodiments, the removal of dummy gate structures forms openings 146, as illustrated by FIG. 14A. In some embodiments, the process used to remove the dummy gate structures is selective and second dielectric layer 138 and the spacer 126 remain when the gate structures are removed. In some embodiments, removing the dummy gate structures also includes removing the gate oxide layer 118 so that a new gate dielectric layer can be formed when forming the metal gate structures in the openings 146.

Figure 15A:
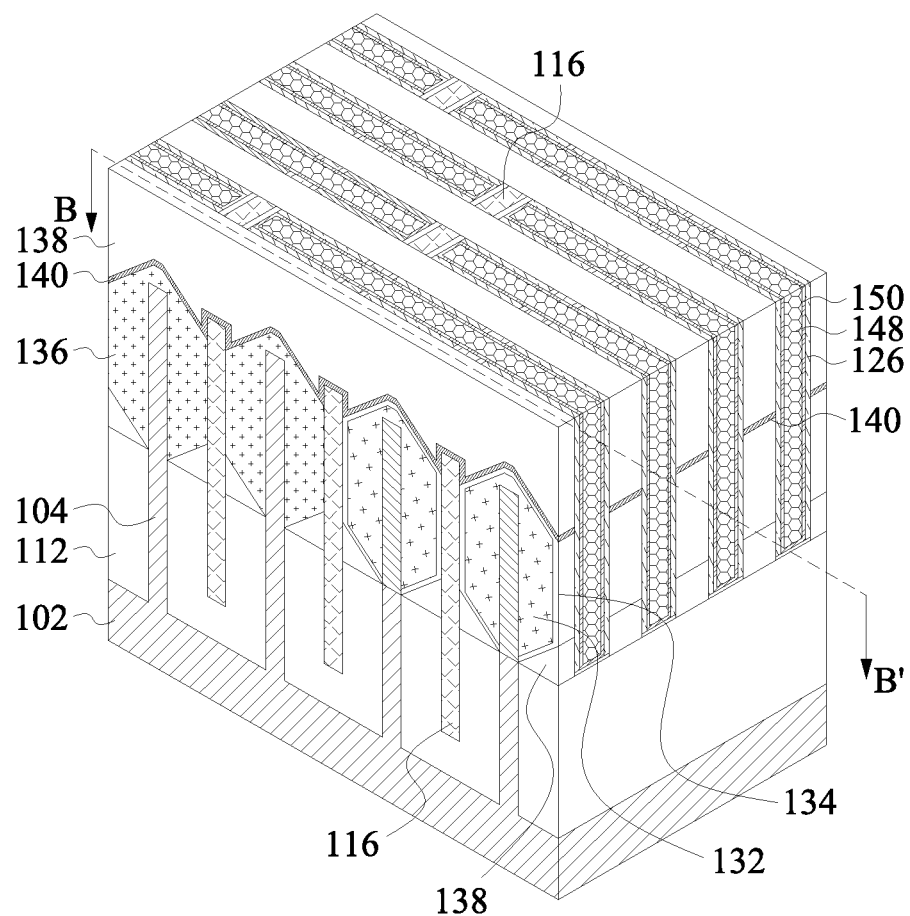
FIGS. 15A-15C are respective isometric, cross-sectional, and top-down views of a partially fabricated fin-based structure after metal gate structure formation, in accordance with some embodiments.
Figure 15B:
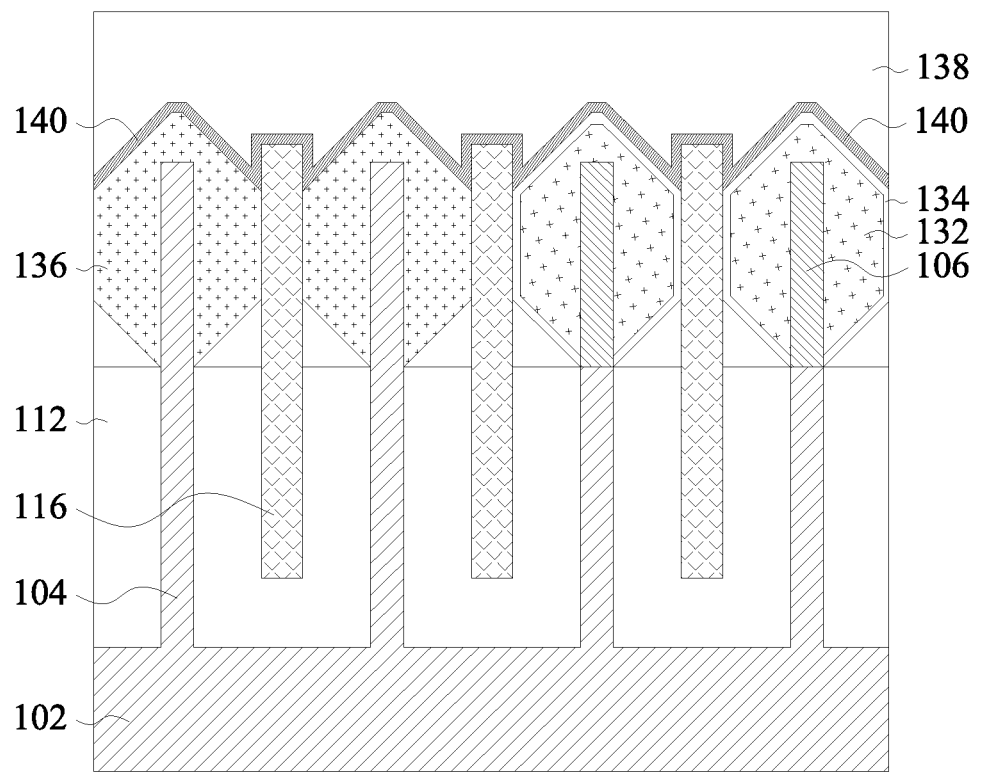
Figure 15C:
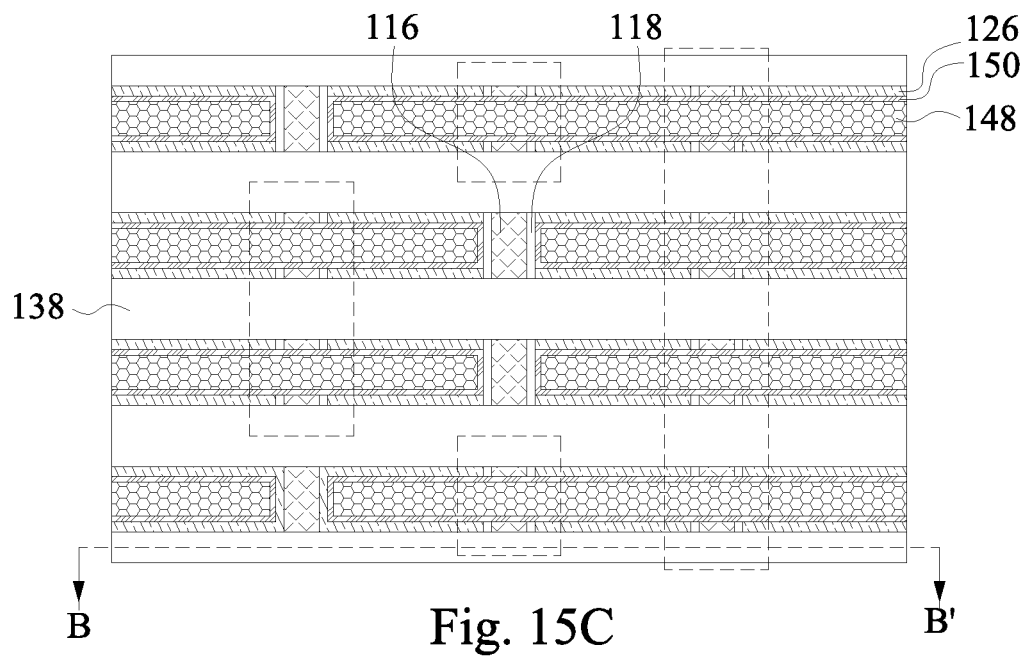

Referring to FIG. 1700, the method 1700 proceeds to operation 1730 by forming metal gate structures, according to some embodiments. FIGS. 15A to 15C show that the metal gate structures with metal gate electrodes 148 are formed in the openings 146. FIGS. 15A and 15C also show that a gate dielectric layer 150 is also formed before forming the metal gate electrodes 148. FIG. 15A is a 3D view of the exemplary structure. FIG. 15C is a top view of the exemplary structure. FIG. 1513 is a cross sectional view of the structure along the B-B' line of the exemplary structure as illustrated by FIGS. 15A and 15C.

In some embodiments, the forming the metal gate structures includes forming the gate dielectric layer 150 in the opening 146 before forming the metal gate electrodes 148. In some embodiments, the gate dielectric layer 150 includes an interfacial layer and a high-k dielectric layer. In some embodiments, the interfacial layer is an $SiO_x$ layer. In some embodiments, the high-k dielectric layer includes a high-k dielectric material such as, for example, hafnium oxide, lanthanum oxide, aluminum oxide, zirconium oxide, silicon nitride, or other suitable high-k materials. In some embodiments, the dielectric constant of the high-k dielectric layer is higher than about 3.9. In some embodiments, the dielectric constant of the high-k dielectric layer is higher than about 7.0. In some embodiments, forming the gate dielectric layer 150 is performed using an ALD process or a CVD process.

In some embodiments, the metal gate electrodes 148 includes a metal conductor such as tungsten (W). In some embodiments, the metal gate electrodes 148 also include a diffusion barrier such as, for example, titanium nitride (TiN) and titanium silicon nitride (TiSiN). In some embodiments, the metal gate electrodes 148 further include a work-function layer such as, for example, TiN and titanium aluminum (TiAl) for n-type FinFET devices and tantalum nitride (TaN) and TiAl for p-type FinFET devices. In some embodiments, forming the metal electrodes 148 is performed using an ALD process or a CVD process.

In some embodiments, after forming the metal gate structures in openings 146, a planarization process (e.g., a CMP process) is performed to remove the metal gate structures formed over the top surface of the second dielectric layer 138. In some embodiments, the planarization process further removes a portion of the second dielectric layer 138 so that the top surfaces of the second dielectric layer 138, the metal gate electrodes 148, and the gate dielectric layer 150 are coplanar. In some embodiments, the top surface of the metal gate electrodes 148 is further coplanar with the top surface of the dummy fin structures 116 that are not etched by the self-aligned etch performed at operation 1726. As discussed at operation 1726, the dummy tin structures 116 exposed by the openings 144 (highlighted in dotted boxes in FIG. 15C) are recessed, and the dummy fin structures 116 that are not opened are not recessed and are thus taller than the dummy fin structures that are recessed. As a result, at the locations where the dummy fin structures 116 are not recessed by the self-aligned etch, the metal gate electrodes 148 are disconnected by the dummy fin structures 116. In contrast, at the locations where the dummy fin structures 116 are recessed by the self-aligned etch, the recessed dummy fin structures are short and the metal gate electrodes 148 remain continuous and connected.

Consequently, by using the dummy fin structures 116 that are recessed by the self-aligned etch process, the metal gate structures are patterned in a self-aligned way without performing additional lithography and patterning processes. Such self-aligned patterning of the metal gate structures not only relaxes the alignment and overlay requirements, but also prevents etch damage to the metal gate structures by avoiding a cut metal gate process using an anisotropic etch (e.g., a dry etch). Further, avoiding the etch damage to the metal gate structures can improve the FinFET device performances by preventing work-function damage and threshold voltage shift caused by damaged metal gate structures.

Referring to FIG. 1700, the method 1700 proceeds to operation 1732 by forming source/drain contacts, according to some embodiments. FIGS. 16A to 16C show that the source/drain contacts 152 are formed over the active fin structures 104 of the n-type FinFET devices and the upper sections 106 of the p-type FinFET devices. FIGS. 16A and 16B also show that a silicide layer 154 is also formed between the source/drain contact 152 and the epitaxy layers 136 and 132. FIG. 16C is a top view of the exemplary structure. FIG. 16B is a cross sectional view of the structure along the B-B' line of the exemplary structure as illustrated by FIGS. 16A and 16C.

In some embodiments, the source/drain contacts 152 are made of metal such as, for example, cobalt (Co), tungsten (W), copper (Cu), nickel (Ni), ruthenium (Ru), or other suitable materials. In some embodiments, the source/drain contacts 152 further include a barrier layer to avoid diffusion of materials from the source/drain contacts 152 into the second dielectric layer 138, or vice versa. In some embodiments, forming the source/drain contacts 152 is performed using an ALD process, a CVD process, a PVD process, or a combination thereof. In some embodiments, forming the source/drain contacts 152 further includes a planarization process (e.g., a CMP process) to remove the source/drain contacts 152 that are formed over the top surface of second dielectric layer 152 or the top surface of the metal gate structures. In some embodiments, after the planarization process, the top surface of the source/drain contacts, the top surface of the second dielectric layer 138, and the top surface of the metal gate electrodes 148 are coplanar.

In some embodiments, forming the source/drain contacts further includes forming a silicide layer 154 between the source/drain contacts 152 and the epitaxy layers 136 and 132. In some embodiments, forming the silicide layer 154 includes removal of the CESL 140 that covers the top surface of the epitaxy layers 136 and 132. In some embodiments, after removing the CESL 140, an additional etch is performed to recess the top surfaces of the epitaxy layers 136 and 132, as illustrated by FIG. 16B, to form a flat surface for the source/drain contacts. In some embodiments, recessing the epitaxy layers 136 and 132 increases the contact area between the source/drain contacts 152 and the epitaxy layers and reduces contact resistance. In some embodiments, forming the silicide is performed by a silicidation process that includes depositing a metal layer, causing the metal to react with the epitaxy layers or the active fin structures or the upper sections of the active fin structures, and removing the un-reacted metal layer. In some embodiments, the silicide layer 154 includes cobalt silicide ($CoSi_x$) or nickel silicide ($NiSi_x$).

The usage of a Ge containing oxide layer over the epitaxy layers enables a self-aligned epitaxy process. The self-aligned epitaxy layer grown on the source/drain regions increases the source/drain landing area for FinFET devices. The usage of a dummy fin structure enables the isolation of the epitaxy layers in a self-aligned manner. The application of a self-aligned etch process to recess the dummy fin structures at areas defined by a pattern enables the isolation of the metal gate structures in a self-aligned manner. The self-aligned isolation of the metal gate structures also prevents or minimizes damage to the metal gate structures and improves device performance. With the Ge containing oxide, the self-aligned epitaxy process, the dummy fin structures, and the self-aligned etch process to pattern the dummy fin structures for metal gate isolation, a number of benefits can be obtained such as, for example, (i) improved process integration; (ii) improved device performance; and (iii) improved margin for further device size scaling.

In some embodiments, a fin field effect transistor (FinFET) device structure includes a substrate. The structure further includes a first tin structure protruding from the substrate and doped with n-type dopants. The structure further includes a second fin structure protruding from the substrate and its upper section is doped with p-type dopants. The structure further includes a first epitaxy layer grown on the source/drain regions of the first fin structure, and a second epitaxy layer grown on the source/drain regions the second fin structure. The structure further includes a third fin structure formed in parallel with the first and second fin structures, and the third fin structure is formed between the first and second fin structures and between the first and second epitaxy layers. The third fin structure is made of a different material from the material of the first or the second fin structures. The structure further includes a Ge containing oxide layer formed on the surface of the second epitaxy layer.

In some embodiments, a method of forming a FinFET device structure includes forming a plurality of first fin structures protruding from a substrate. The method further includes doping a first portion of the first fin structures with n-type dopants, and an upper section of the a second portion of the first fin structures with p-type dopants. The method further includes forming a plurality of second fin structures between each of the plurality of first fin structures. The method further includes growing a SiGe epitaxy layer on the source/drain region of the second portion of the first fin structures. The method further includes forming a Ge containing oxide layer on the SiGe epitaxy layer to protect the surface of the SiGe epitaxy layer in a subsequent epitaxy step. The method further includes growing a silicon epitaxy layer on the source/drain regions of the first portion of the first fin structures.

In some embodiments, a semiconductor structure includes a substrate. The semiconductor structure further includes a plurality of first fin structures doped with n-type dopants and protruding from the substrate. The semiconductor structure further includes a plurality of second fin structures protruding from the substrate and parallel to the plurality of first fin structures, and the plurality of second fin structures have an upper section doped with p-type dopants. The semiconductor structure further includes a first dielectric layer formed on the substrate and on a side surface of each of the first and second plurality of first fin structures. A top surface of the first dielectric layer is below a top surface of the first and second plurality of first fin structure. The semiconductor structure further includes a plurality of dummy fin structures parallel to the plurality of first fin structures and the plurality of second fin structures. At least one of the plurality of dummy fin structures is formed between each of the first fin structures and each of the second fin structures, and the plurality of dummy fin structures have a bottom surface below the top surface of the first dielectric layer. The semiconductor structure further includes a SiGe epitaxy layer formed on the plurality of second fin structures. The semiconductor structure further includes a Ge containing oxide layer formed on the SiGe epitaxy layer to protect the SiGe epitaxy layer in a subsequent epitaxy step. The semiconductor structure further includes a Si epitaxy layer formed on the plurality of first fin structures.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The foregoing disclosure outlines features of several embodiments so that a person of ordinary skill in the art may better understand the aspects of the present disclosure. A person of ordinary skill in the art will appreciate that they may readily use the present disclosure as a basis for designing or modifying other processes and structures for carrying out the same purposes and/or achieving the same advantages of the embodiments introduced herein. A person of ordinary skill in the art will also realize that such equivalent constructions do not depart from the spirit and scope of the present disclosure, and that they may make various changes, substitutions, and alterations herein without departing from the spirit and scope of the present disclosure.

What is claimed is:

1. A method of forming a fin field effect transistor (FinFET) device structure, comprising:
   forming a first fin structure protruding from a substrate;
   doping the first fin structure with n-type dopants;
   forming a second fin structure protruding from the substrate;
   doping an upper section of the second fin structure with p-type dopants;
   growing a first epitaxy layer on a source/drain region of the first fin structure;
   growing a second epitaxy layer on a source/drain region of the second fin structure;
   forming a third fin structure between the first and second fin structures and between the first and second epitaxy layers, wherein the third fin structure is formed with a different material than the first and second fin structures; and
   forming a germanium (Ge) containing oxide layer on the second epitaxy layer.

2. The method of claim 1, wherein forming the first epitaxy layer comprises growing a silicon epitaxy layer.

3. The method of claim 1, wherein growing the first epitaxy layer comprises exposing the source/drain region of the first fin structure and the Ge containing oxide layer to a cleaning process.

4. The method of claim 3, wherein the cleaning process removes a native oxide formed on the source/drain region of the first fin structure, and the second epitaxy layer remains after the cleaning process.

5. The method of claim 1, wherein forming the third fin structure comprises:
   forming at least one trench by depositing a first dielectric layer over a top surface and a side surface of the first and second fin structures;
   filling the at least one trench with a second dielectric layer; and
   planarizing a top surface of the second dielectric layer to be coplanar with a top surface of the first dielectric layer.

6. The method of claim 1, wherein forming the Ge containing oxide layer on the second epitaxy layer comprises exposing the second epitaxy layer to oxidizing agents comprising ozone ($O_3$), a sulfuric acid ($H_2SO_4$) and hydrogen peroxide ($H_2O_2$) mixture, or an ammonia hydroxide ($NH_4OH$) and hydrogen peroxide ($H_2O_2$) mixture.

7. The method of claim 1, further comprising depositing a dielectric layer on the substrate and between the first and second fin structures, wherein a top surface of the dielectric layer is below a top surface of each of the first and second fin structures.

8. The method of claim 1, wherein forming the second epitaxy layer comprises growing a silicon germanium (SiGe) layer.

9. The method of claim 1, wherein forming the third fin structure comprises depositing silicon carbon nitride (SiCN), silicon oxygen carbon nitride (SiOCN), hafnium oxide ($HfO_2$), zirconium oxide ($ZrO_2$), or aluminum oxide ($Al_2O_3$).

10. A method of forming a fin field effect transistor (FinFET) device structure, comprising:
    forming a plurality of first fin structures protruding from a substrate;
    doping a first portion of the plurality of first fin structures with n-type dopants;
    doping a second portion of the plurality of first fin structures with p-type dopants;

forming at least one second fin structure between each of the plurality of first fin structures;

growing a silicon germanium (SiGe) epitaxy layer on source/drain regions of the second portion of the plurality of first fin structures;

forming a germanium (Ge) containing oxide layer on the SiGe epitaxy layer; and growing a silicon (Si) epitaxy layer on the source/drain regions of the first portion of the plurality of first fin structures.

11. The method of claim 10, wherein forming the Ge containing oxide layer on the SiGe epitaxy layer comprises exposing the SiGe epitaxy layer to oxidizing agents comprising ozone ($O_3$), a sulfuric acid ($H_2SO_4$) and hydrogen peroxide ($H_2O_2$) mixture, or an ammonia hydroxide ($NH_4OH$) and hydrogen peroxide ($H_2O_2$) mixture.

12. The method of claim 10, wherein growing the Si epitaxy layer comprises:

exposing source/drain regions of the first portion of the plurality of first fin structures and the Ge containing oxide layer on the SiGe epitaxy layer;

performing a cleaning process to remove a native oxide formed on the source/drain regions of the first portion of the plurality of first fin structures, wherein the SiGe epitaxy layer remains after the cleaning process; and growing the Si epitaxy layer on the source/drain regions of the first portion of the plurality of first fin structures without growing the Si epitaxy layer on the SiGe epitaxy layer.

13. The method of claim 10, further comprising:

forming a plurality of poly gate structures comprising a poly gate electrode, wherein the plurality of poly gate structures are formed over a top surface and a side surface of the plurality of first fin structures and the at least one second fin structure;

forming a first dielectric layer on the side surfaces of the plurality of gate structures;

forming a second dielectric layer between side surfaces of the plurality of poly gate structures and on the first dielectric layer;

forming a pattern over the plurality of poly gate structures and the second dielectric layer; and etching, in an open area defined by the pattern, a portion of the plurality of poly gate structures and a portion of the at least one second fin structure;

wherein an etching rate for etching the plurality of poly gate structures and the portion of the at least one second fin structure is faster than an etching rate for etching the second dielectric layer.

14. The method of claim 13, further comprising:

removing the poly gate electrode of the plurality of the poly gate structures;

depositing a plurality of metal gate structures between the side surfaces of the second dielectric layer; and performing a first planarization process to coplanarize top surfaces of the plurality of metal gate structures with a top surface of the at least one second fin structure;

wherein the plurality of metal gate structures are separated from one another by the at least one second fin structure.

15. The method of claim 10, wherein forming the at least one second fin structure comprises:

forming at least one trench by depositing a first dielectric layer over a top surface and a side surface of the plurality of first fin structures;

filling the at least one trench with a second dielectric layer; and planarizing a top surface of the second dielectric layer to be coplanar with a top surface of the first dielectric layer.

16. A method of forming a semiconductor structure, comprising:

forming first fin structures protruding from a substrate;

doping the first fin structures with n-type dopants;

forming second fin structures protruding from the substrate and parallel to the first fin structures;

doping the second fin structures with p-type dopants;

forming a dielectric layer on a side surface of each of the first and second fin structures;

recessing the dielectric layer such that a top surface of the dielectric layer is below top surfaces of the first and second fin structures;

forming a plurality of dummy fin structures parallel to the first and second fin structures, wherein at least one of the plurality of dummy fin structures is formed between each of the first fin structures and each of the second fin structures, and wherein the plurality of dummy fin structures have a bottom surface below the top surface of the dielectric layer;

growing a silicon germanium (SiGe) epitaxy layer on the second fin structures;

growing a germanium (Ge) containing oxide layer on the SiGe epitaxy layer; and growing a silicon (Si) epitaxy layer on the first fin structures.

17. The method of claim 16, further comprising forming a metal gate structure over the top surface and the side surface of each of the first and second fin structures.

18. The method of claim 16, wherein growing the Ge containing oxide layer on the SiGe epitaxy layer comprises exposing the SiGe epitaxy layer to oxidizing agents comprising ozone ($O_3$), a sulfuric acid ($H_2SO_4$) and hydrogen peroxide ($H_2O_2$) mixture, or an ammonia hydroxide ($NH_4OH$) and hydrogen peroxide ($H_2O_2$) mixture.

19. The method of claim 16, wherein growing the Si epitaxy layer comprises:

exposing source/drain regions of the first fin structures and the Ge containing oxide layer on the SiGe epitaxy layer;

performing a cleaning process to remove a native oxide formed on the source/drain regions of the first fin structures, wherein the SiGe epitaxy layer remains after the cleaning process; and growing the Si epitaxy layer on the source/drain regions of the first fin structures without growing the Si epitaxy layer on the SiGe epitaxy layer.

20. The method of claim 16, wherein forming the plurality of dummy fin structures comprises:

forming at least one trench by depositing a first dielectric layer over the top surface and the side surface of the first fin structures;

filling the at least one trench with a second dielectric layer; and planarizing a top surface of the second dielectric layer to be coplanar with a top surface of the first dielectric layer.

* * * * *